United States Patent
Chen et al.

(10) Patent No.: US 12,230,713 B2
(45) Date of Patent: Feb. 18, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chia-Wei Chen, Hsinchu (TW); Chi-Sheng Lai, Hsinchu (TW); Shih-Hao Lin, Hsinchu (TW); Jian-Hao Chen, Hsinchu (TW); Kuo-Feng Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 784 days.

(21) Appl. No.: 17/410,048

(22) Filed: Aug. 24, 2021

(65) Prior Publication Data
US 2022/0320337 A1    Oct. 6, 2022

Related U.S. Application Data

(60) Provisional application No. 63/168,162, filed on Mar. 30, 2021.

(51) Int. Cl.
*H01L 29/06*    (2006.01)
*H01L 21/324*   (2006.01)
(Continued)

(52) U.S. Cl.
CPC ........ *H01L 29/7851* (2013.01); *H01L 21/324* (2013.01); *H01L 21/823418* (2013.01); *H01L 21/823431* (2013.01); *H01L 29/0673* (2013.01); *H01L 29/0847* (2013.01); *H01L 29/41791* (2013.01); *H01L 29/42392* (2013.01); *H01L 29/513* (2013.01); *H01L 29/66439* (2013.01); *H01L 29/66795* (2013.01); *H01L 29/775* (2013.01); *H01L 29/78696* (2013.01);
(Continued)

(58) Field of Classification Search
CPC .............. H01L 29/7851; H01L 21/324; H01L 21/823418; H01L 21/823431; H01L 29/0673; H01L 29/0847; H01L 29/41791; H01L 29/66795; H01L 29/42392; H01L 29/513; H01L 29/66439; H01L 29/775; H01L 29/78696; H01L 21/823412; H01L 21/823481; H01L 29/41725; H01L 29/41775; H01L 29/42356; H01L 29/785; B82Y 10/00
See application file for complete search history.

(56) References Cited

U.S. PATENT DOCUMENTS 9,209,247 B2   12/2015   Colinge et al.
9,236,267 B2   1/2016    De et al.
(Continued)

*Primary Examiner* — Earl N Taylor
(74) *Attorney, Agent, or Firm* — NZ CARR LAW OFFICE

(57) ABSTRACT

A transistor is provided. The transistor includes a first source/drain epitaxial feature, a second source/drain epitaxial feature, and two or more semiconductor layers disposed between the first source/drain epitaxial feature and the second source/drain epitaxial feature. The two or more semiconductor layers comprise different materials. The transistor further includes a gate electrode layer surrounding at least a portion of the two or more semiconductor layers, wherein the transistor has two or more threshold voltages.

20 Claims, 35 Drawing Sheets

(51) Int. Cl.
  *H01L 21/8234*  (2006.01)
  *H01L 29/08*    (2006.01)
  *H01L 29/417*   (2006.01)
  *H01L 29/423*   (2006.01)
  *H01L 29/51*    (2006.01)
  *H01L 29/66*    (2006.01)
  *H01L 29/775*   (2006.01)
  *H01L 29/78*    (2006.01)
  *H01L 29/786*   (2006.01)

(52) U.S. Cl.
  CPC ........... *H01L 21/823412* (2013.01); *H01L 21/823481* (2013.01)

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 11,133,305 B2 * | 9/2021 | Ando | H01L 21/28088 |
| 11,450,664 B2 * | 9/2022 | Huang | H01L 29/42392 |
| 11,894,460 B2 * | 2/2024 | Hsu | H01L 29/6684 |
| 2016/0268375 A1 * | 9/2016 | Chen | H01L 29/66742 |
| 2017/0170269 A1 * | 6/2017 | Balakrishnan | H01L 29/42356 |
| 2018/0047832 A1 * | 2/2018 | Tapily | H01L 29/66545 |
| 2018/0114833 A1 * | 4/2018 | Bao | H01L 29/42392 |
| 2018/0151732 A1 * | 5/2018 | Mehandru | H01L 29/78696 |
| 2019/0267494 A1 * | 8/2019 | Kim | H01L 29/0653 |
| 2020/0365584 A1 * | 11/2020 | Ando | H01L 21/02532 |
| 2020/0411513 A1 * | 12/2020 | Jambunathan | H01L 27/0924 |
| 2021/0175129 A1 * | 6/2021 | Yeong | H01L 29/66666 |
| 2021/0343858 A1 * | 11/2021 | Wang | H01L 29/66439 |
| 2021/0359142 A1 * | 11/2021 | Huang | H01L 29/0673 |
| 2021/0398977 A1 * | 12/2021 | Mishra | H01L 27/092 |
| 2022/0052046 A1 * | 2/2022 | Choi | H01L 29/7851 |
| 2022/0093596 A1 * | 3/2022 | Lavric | H01L 27/0924 |
| 2022/0102148 A1 * | 3/2022 | Wallace | H01L 29/66742 |
| 2022/0165731 A1 * | 5/2022 | Huang | H01L 21/02603 |
| 2022/0278110 A1 * | 9/2022 | Liaw | H01L 27/0924 |
| 2022/0302275 A1 * | 9/2022 | Yu | H01L 21/823842 |
| 2022/0320337 A1 * | 10/2022 | Chen | H01L 21/324 |
| 2022/0320342 A1 * | 10/2022 | Hsu | H01L 29/66545 |
| 2022/0384434 A1 * | 12/2022 | Huang | H01L 21/823814 |
| 2023/0378352 A1 * | 11/2023 | Hsu | H01L 21/02236 |

* cited by examiner

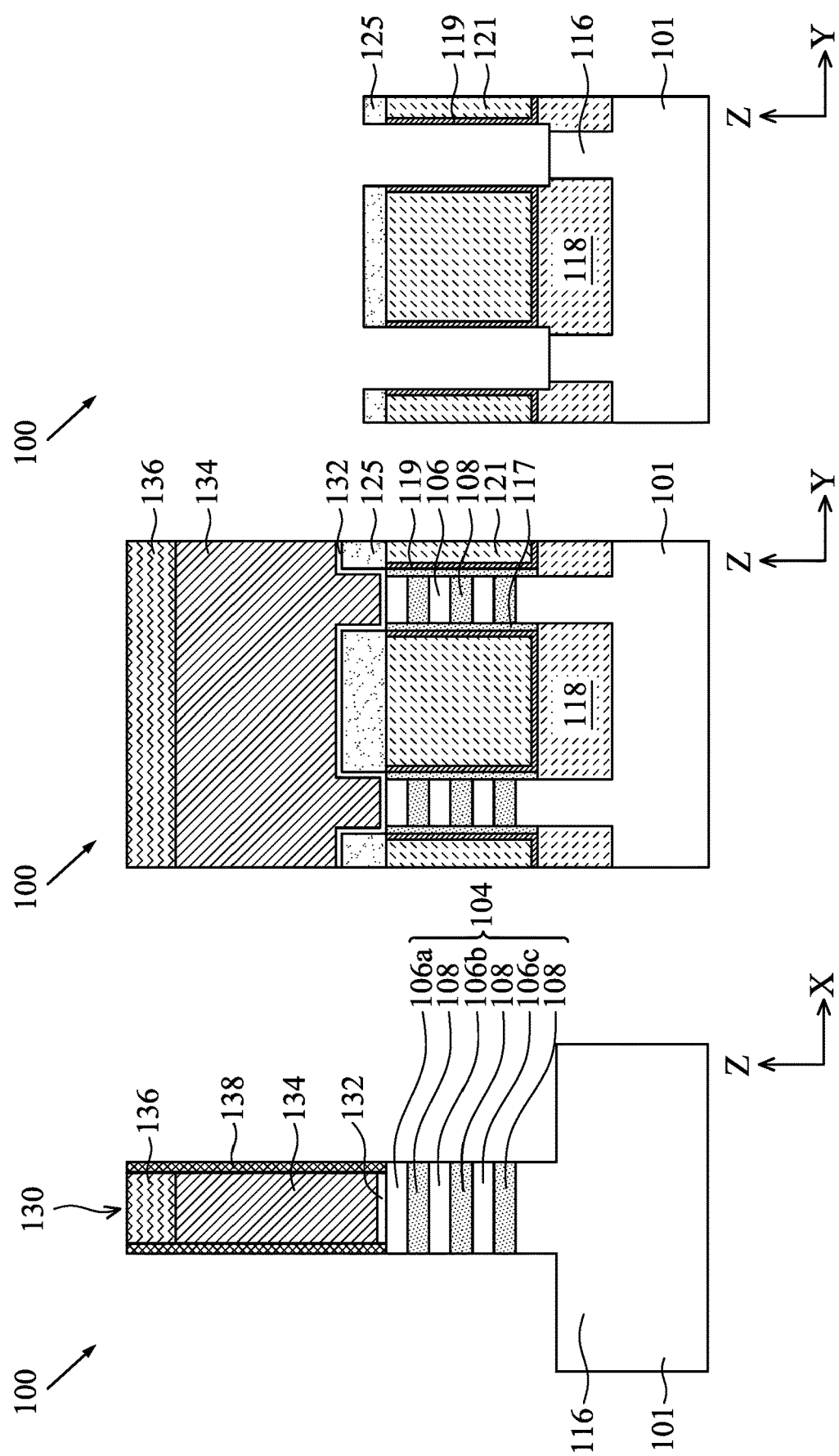

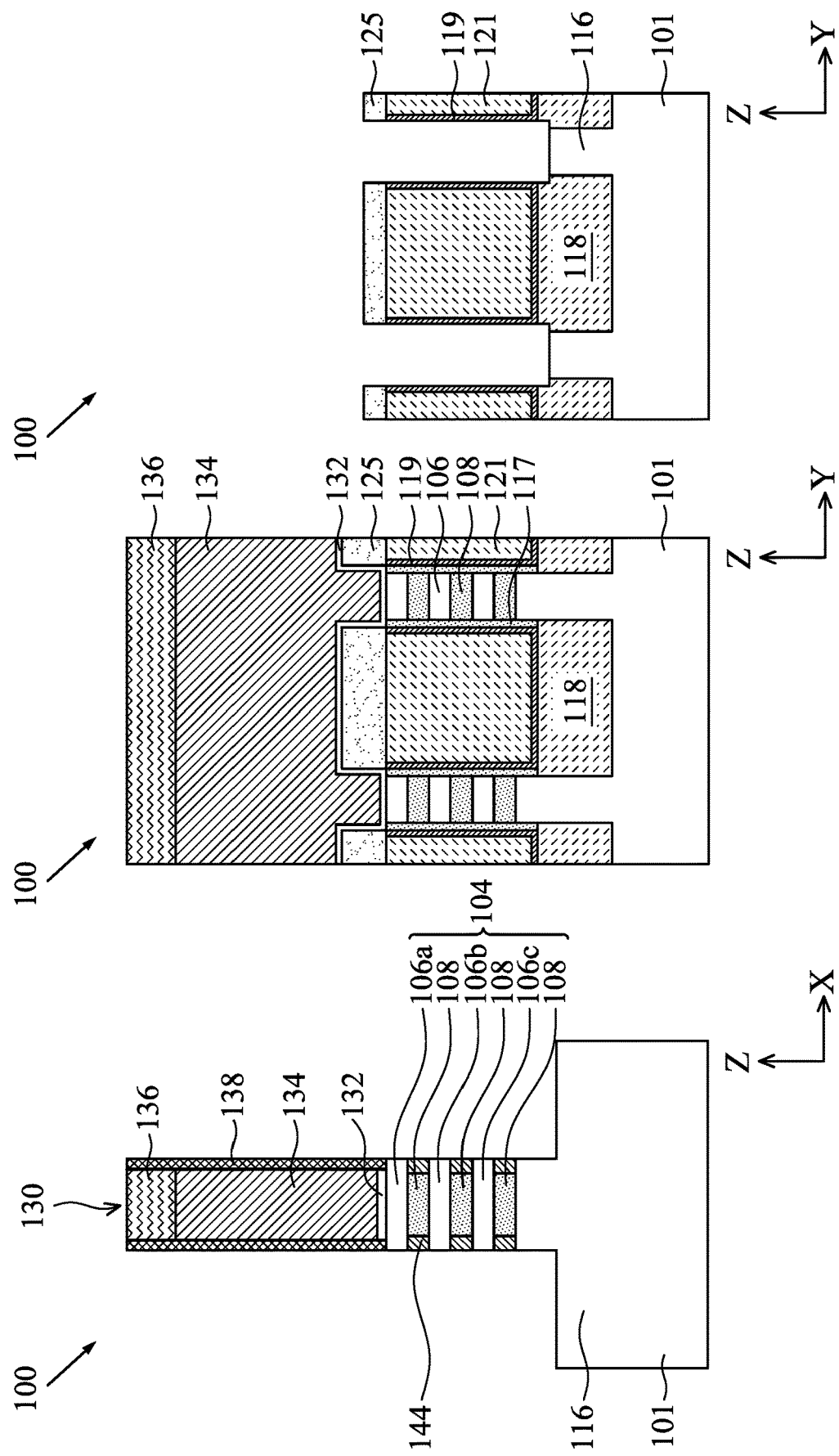

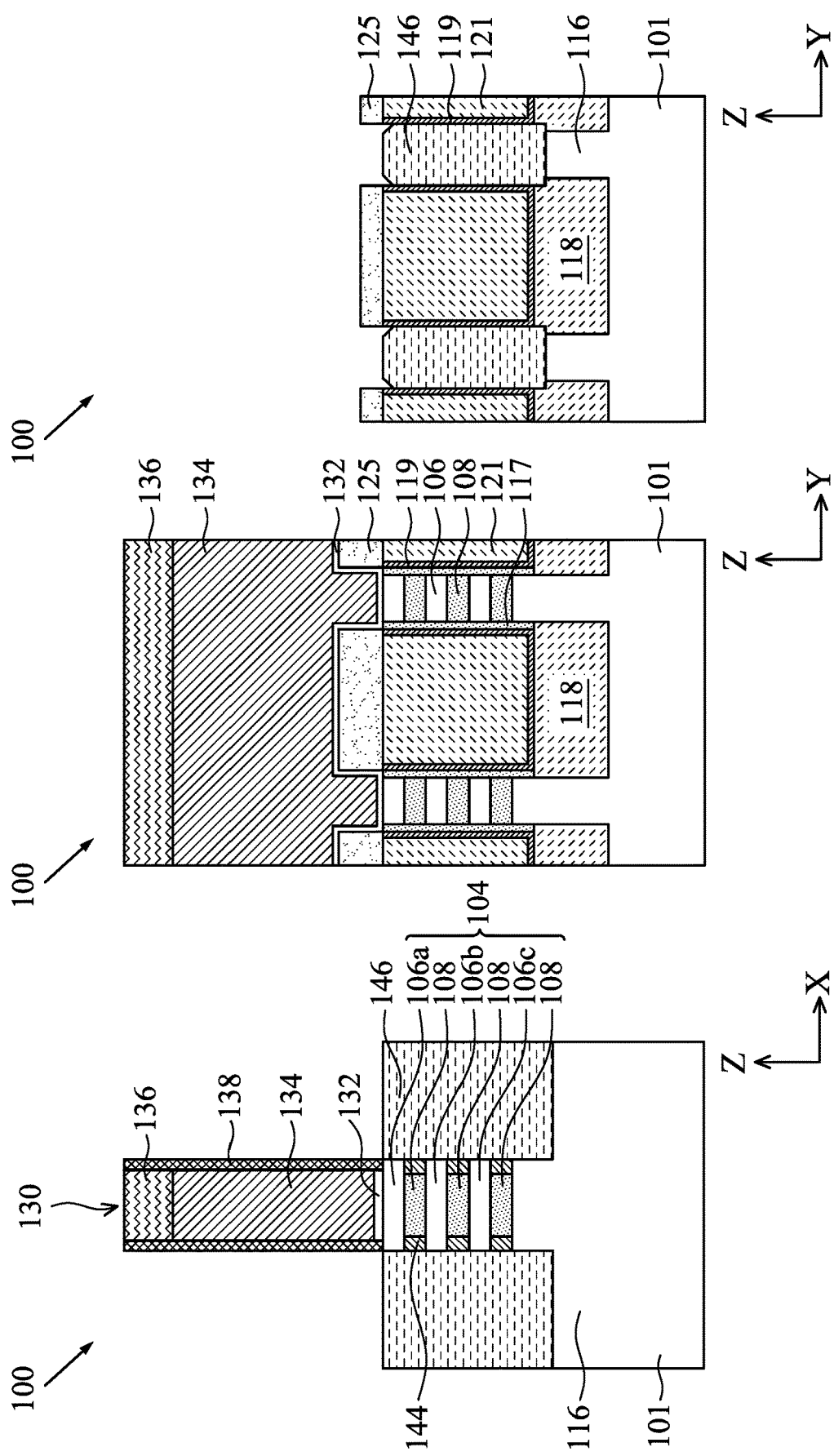

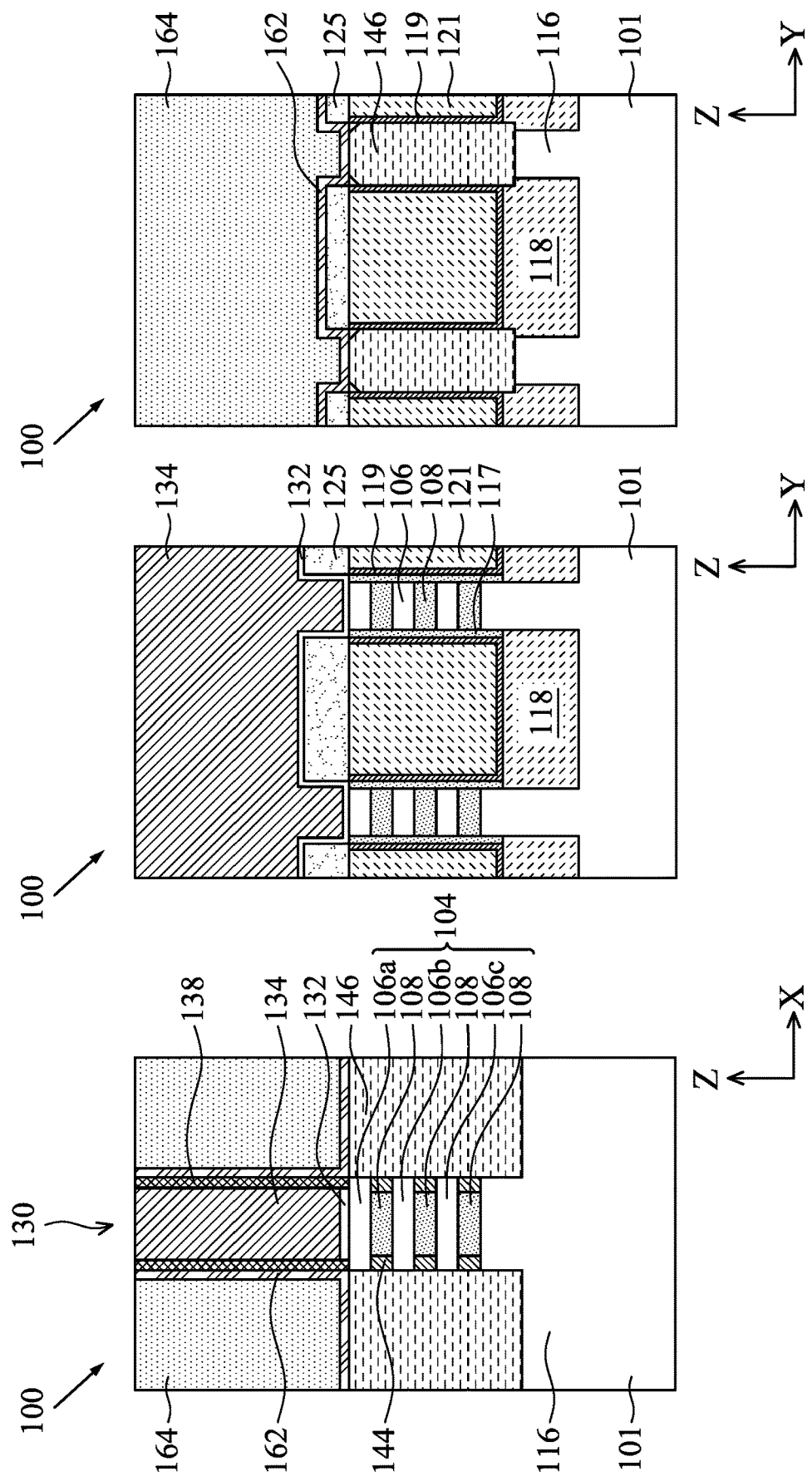

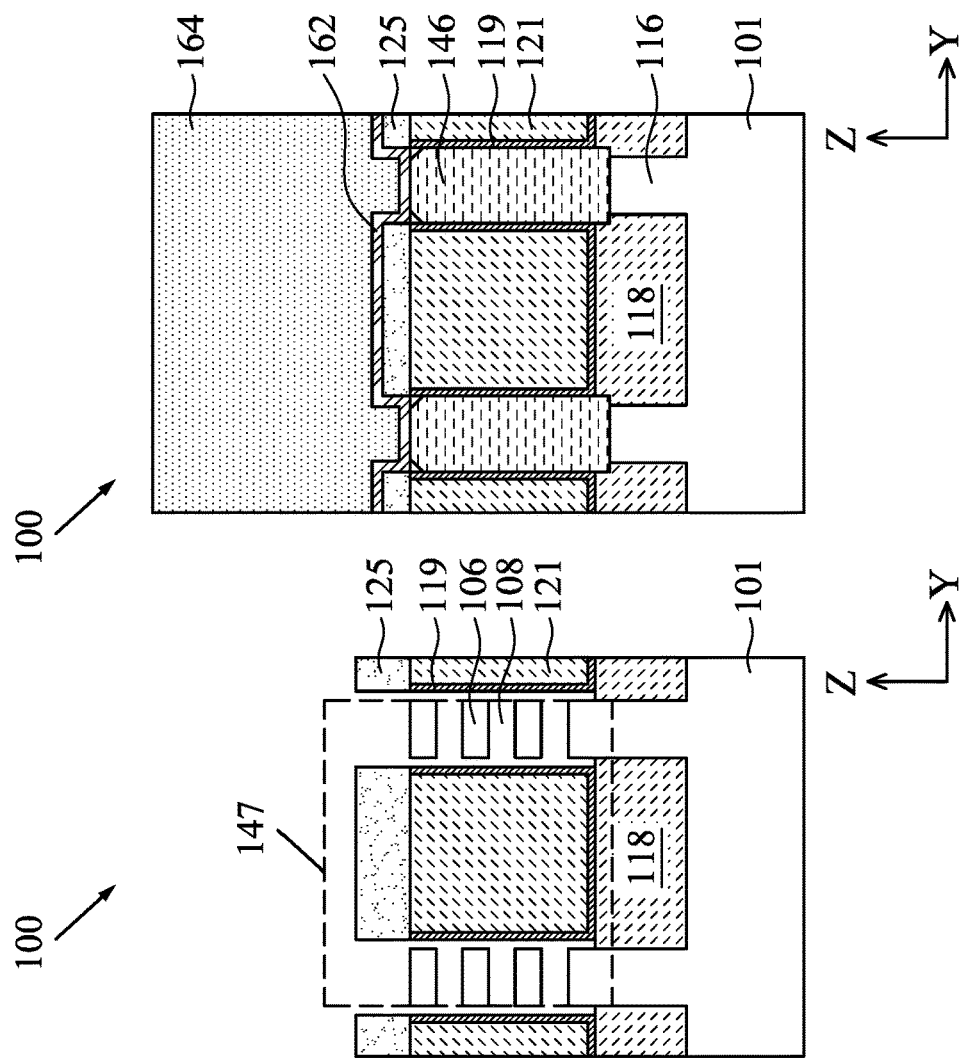
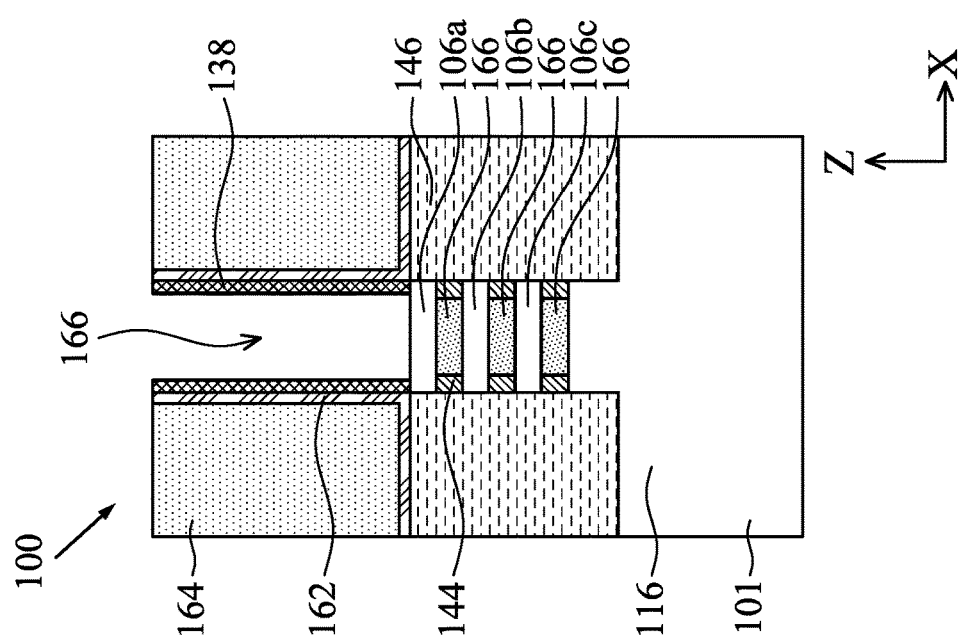
FIG. 13A   FIG. 13B   FIG. 13C

| State | Base-6 | S1_Charge | S2_Charge | Note |
|---|---|---|---|---|
| 1 | 0 | 0 | Q/3 | 1-sheet on |
| 2 | 1 | 0 | 2Q/3 | 2-sheet on |
| 3 | 2 | 0 | Q | 3-sheet on |
| 4 | 3 | Q/3 | 0 | 1-sheet on |
| 5 | 4 | 2Q/3 | 0 | 2-sheet on |
| 6 | 5 | Q | 0 | 3-sheet on |

FIG. 28B

| # of Channel | # of Vt in one transistor | # of States in CMOS SRAM Cell |
|---|---|---|
| 2 | 2 | 4 |
| 3 | 3 | 6 |
| 4 | 4 | 8 |
| 5 | 5 | 10 |
| 6 | 6 | 12 |
| 7 | 7 | 14 |
| 8 | 8 | 16 |

FIG. 31B

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge.

In pursuit of higher device density, higher performance, and lower costs, challenges from both fabrication and design issues have resulted in the development of three-dimensional designs, such as a multi-gate field effect transistor (FET), including a nanostructure FET. In a nanostructure FET, side surfaces of the channel are surrounded by the gate electrode, which allows for fuller depletion in the channel and results in less short-channel effects and better gate control. As transistor dimensions are continually scaled down, further improvements of the nanostructure FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-13A are cross-sectional side views of various stages of manufacturing the semiconductor device structure taken along cross-section A-A of FIG. 8, in accordance with some embodiments.

FIGS. 9B-13B are cross-sectional side views of various stages of manufacturing the semiconductor device structure taken along cross-section B-B of FIG. 8, in accordance with some embodiments.

FIGS. 9C-13C are cross-sectional side views of various stages of manufacturing the semiconductor device structure taken along cross-section C-C of FIG. 8, in accordance with some embodiments.

FIG. 28B is a table showing different states of the memory cell of FIG. 28A, in accordance with some embodiments.

FIG. 31B is a table showing the number of states a memory cell including the semiconductor device structure shown in FIG. 30A, in accordance with some embodiments.

DETAILED DESCRIPTION

Figure 1:
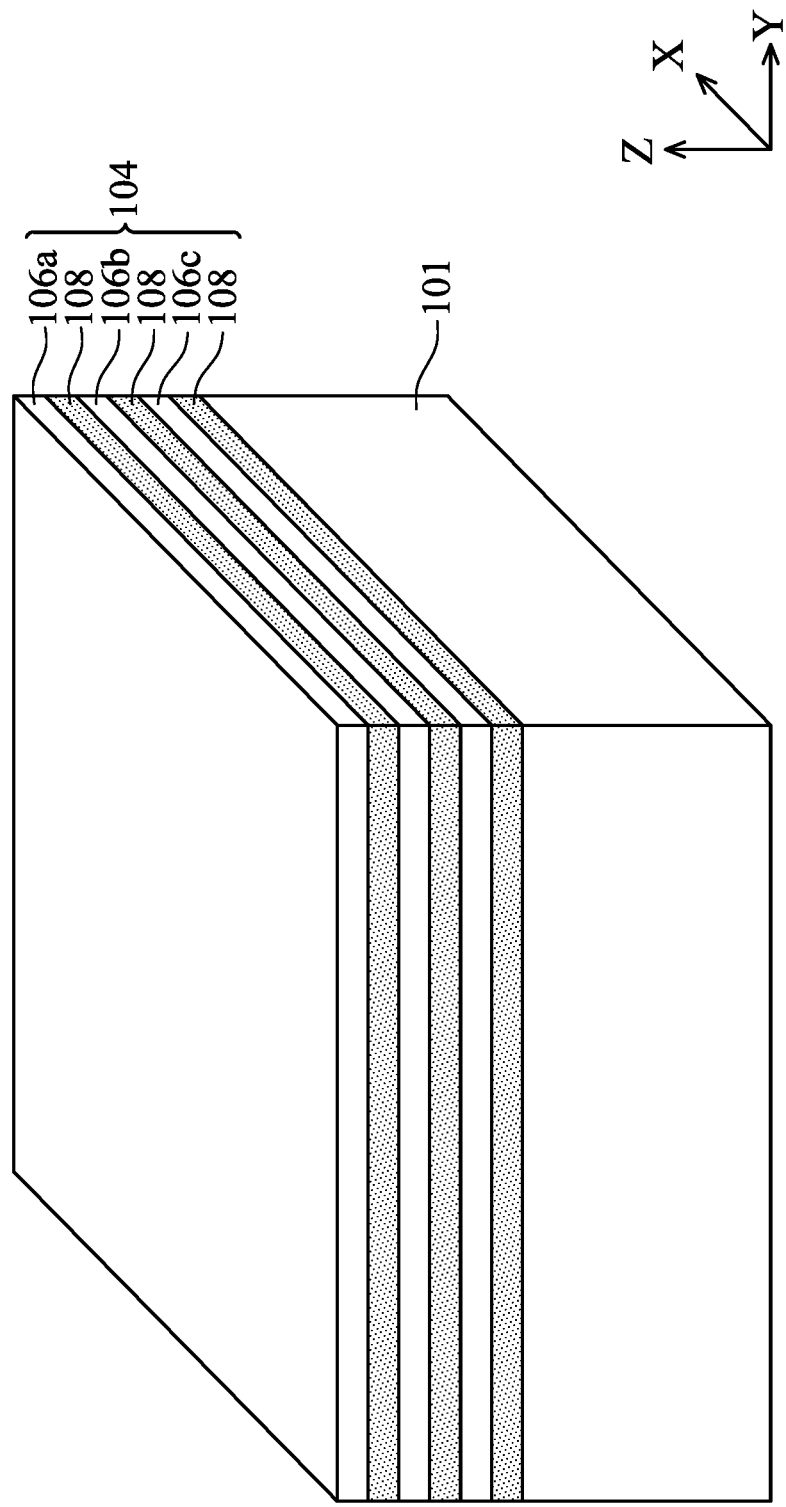
FIGS. 1-8 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanostructure FETs, implementations of some aspects of the present disclosure may be used in other processes and/or in other devices, such as planar FETs, FinFETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-27 show exemplary processes for manufacturing a semiconductor device structure 100 according to embodiments of the present disclosure. It is understood that additional operations can be provided before, during, and after processes shown by FIGS. 1-27, and some of the operations described below can be replaced or eliminated, for additional embodiments of the method. The order of the operations/processes is not limiting and may be interchangeable.

FIGS. 1-8 are perspective views of various stages of manufacturing a semiconductor device structure 100 in accordance with some embodiments. As shown in FIG. 1, the semiconductor device structure 100 includes a stack of semiconductor layers 104 formed over a substrate 101. The substrate 101 may be a semiconductor substrate. The substrate 101 may include a crystalline semiconductor material such as, but not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the substrate 101 is made of silicon. In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type impurities). Depending on circuit design, the dopants may be, for example boron for p-type field effect transistors (p-type FETs) and phosphorus for n-type field effect transistors (n-type FETs).

The stack of semiconductor layers 104 includes semiconductor layers made of different materials to facilitate formation of nanostructure channels in a multi-gate device, such as nanostructure FETs. In some embodiments, the stack of semiconductor layers 104 includes first semiconductor layers 106 (106a, 106b, 106c) and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si doped with Ge and the second semiconductor layers 108 may be made of SiGe. In some examples, the first semiconductor layers 106 may be made of SiGe and the second semiconductor layers 108 may be made of Si. In some embodiments, the first semiconductor layers 106 may be made of SiGe having a first Ge concentration range, and the second semiconductor layers 108 may be made of SiGe having a second Ge concentration range. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The thickness of the first semiconductor layers 106 and the second semiconductor layers 108 may vary depending on the application and/or device performance considerations. In some embodiments, each first and second semiconductor layer 106, 108 has a thickness in a range between about 5 nm and about 30 nm. In other embodiments, each first and second semiconductor layer 106, 108 has a thickness in a range between about 10 nm and about 20 nm. In some embodiments, each first and second semiconductor layer 106, 108 has a thickness in a range between about 6 nm and about 12 nm. Each second semiconductor layer 108 may have a thickness that is equal to, less than, or greater than the thickness of the first semiconductor layer 106. The second semiconductor layers 108 may eventually be removed and serve to define a vertical distance between adjacent channels for the semiconductor device structure 100.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define channels of the semiconductor device structure 100 is further discussed below.

In some embodiments, the first semiconductor layers 106a, 106b, 106c have different compositions in order for the nanostructure FET formed from the first semiconductor layers 106a, 106b, 106c to have three different threshold voltages. The first semiconductor layers 106a, 106b, 106c including different compositions lead to different electrical conductivity, as a result, different threshold voltages may be applied to the subsequently formed gate electrode layer to cause the first semiconductor layers 106a, 106b, 106c to be electrically conductive. For example, the first semiconductor layer 106a includes a first material having a first electrical conductivity, the first semiconductor layer 106b includes a second material having a second electrical conductivity, and the first semiconductor layer 106c includes a third material having a third electrical conductivity. A first voltage may be applied to the gate electrode layer to cause one of the first semiconductor layers 106a, 106b, 106c to be electrically conductive, while the remaining two of the first semiconductor layers 106a, 106b, 106c are not electrically conductive under the first voltage. A second voltage greater than the first voltage may be applied to the gate electrode layer to cause two of the first semiconductor layers 106a, 106b, 106c to be electrically conductive, while the remaining one of the first semiconductor layers 106a, 106b, 106c is not electrically conductive. A third voltage greater than the second voltage may be applied to the gate electrode layer to cause all three of the first semiconductor layers 106a, 106b, 106c to be electrically conductive. As a result of using different materials for the first semiconductor layers 106, a single transistor, such as a single FET, can have multiple threshold voltages, leading to improved device density.

In some embodiments, the first semiconductor layer 106a is made of Si or SiGe having a first germanium concentration, the first semiconductor layer 106b is made of SiGe having a second germanium concentration substantially greater than the first germanium concentration, and the first semiconductor layer 106c is made of SiGe having a third germanium concentration substantially greater than the second germanium concentration. For example, the ratio of the second germanium concentration to the first germanium concentration ranges from about 1.1 to about 2, and the ratio of the third germanium concentration to the second germanium concentration ranges from about 1.1 to about 2. The first germanium concentration may range from about 0 atomic percent to about 10 atomic percent, the second germanium concentration may range from about 1 atomic percent to about 20 atomic percent, and the third germanium concentration may range from about 2 atomic percent to about 30 atomic percent. In this example, the second semiconductor layers 108 may be made of SiGe and the germanium concentration of the second semiconductor layers 108 may be greater than about 50 atomic percent, such as from about 50 atomic percent to about 80 atomic percent, in order to have etch selectivity compared to the first semiconductor layers 106a, 106b, 106c.

In some embodiments, the first semiconductor layers 106 are channels of an n-type FET, and increased germanium concentration may lead to higher threshold voltage for the n-type FET. In some embodiments, the first semiconductor layers 106 are channels of a p-type FET, and increased germanium concentration may lead to lower threshold voltage for the p-type FET.

In some embodiments, the first semiconductor layer 106a includes a semiconductor doped with a dopant having a first dopant concentration, the first semiconductor layer 106b includes the semiconductor doped with the dopant having a second dopant concentration that is about 5 times to about 10 times greater than the first dopant concentration, and the first semiconductor layer 106c includes the semiconductor doped with the dopant having a third dopant concentration that is about 5 times to about 10 times greater than the second dopant concentration. For example, the first dopant concentration ranges from about $1\times10^{15}/cm^{-3}$ to about $5\times10^{15}/cm^{-3}$, the second dopant concentration ranges from about $1\times10^{16}/cm^{-3}$ to about $5\times10^{16}/cm^{-3}$, and the third dopant concentration ranges from about $1\times10^{17}/cm^{-3}$ to about $5\times10^{17}/cm^{-3}$. In some embodiments, the ratio of the second dopant concentration to the first dopant concentration ranges from about 5 to about 10, and the ratio of the third dopant concentration to the second dopant concentration ranges from about 5 to about 10. In some embodiments, the first dopant concentration is about 5 times to about 10 times greater than the second dopant concentration, which is about 5 times to about 10 times greater than the third dopant concentration. For example, the first dopant concentration ranges from about $1\times10^{17}/cm^{-3}$ to about $5\times10^{17}/cm^{-3}$, the second dopant concentration ranges from about $1\times10^{16}/cm^{-3}$ to about $5\times10^{16}/cm^{-3}$, and the third dopant concentration ranges from about $1\times10^{15}/cm^{-3}$ to about $5\times10^{15}/cm^{-3}$. In some embodiments, the ratio of the first dopant concentration to the second dopant concentration ranges from about 5 to about 10, and the ratio of the second dopant concentration to the third dopant concentration ranges from about 5 to about 10. The difference in dopant concentrations in the first semiconductor layers 106a, 106b, 106c lead to different threshold voltages. Thus, if the difference is too small, such as less than about 5 times, the two first semiconductor layers 106 (106a/106b or 106b/106c) may be electrically conductive when one voltage is applied thereto. On the other hand, if the difference is too large, such as greater than about 10 times, voltages applied to cause the first semiconductor layers 106 with greater dopant concentration to be conductive may be unnecessarily too large. Furthermore, if the differences in the composition of the first semiconductor layers 106 are too large, subsequent processes to remove portions of the first and second semiconductor layers 106, 108 may become more complicated. The semiconductor may be silicon, silicon germanium, or other suitable semiconductors. The dopant may be B, Al, Ga, In, P, As, or another suitable dopant. In some embodiments, the first semiconductor layer 106a is made of silicon doped with a first dopant, the first semiconductor layer 106b is made of silicon doped with a second dopant different from the first dopant, and the first semiconductor layer 106c is made of silicon doped with a third dopant different from the first and second dopants.

In some embodiments, the first semiconductor layers 106 are channels of an n-type FET. If the dopant in the first semiconductor layers 106 are p-type dopants, such as B, Al, Ga, or In, increased dopant concentration may lead to higher threshold voltage for the n-type FET. On the other hand, if the dopant in the first semiconductor layers 106 are n-type dopants, such as P or As, increased dopant concentration may lead to lower threshold voltage for the n-type FET. In some embodiments, the first semiconductor layers 106 are channels of a p-type FET. If the dopant in the first semiconductor layers 106 are p-type dopants, such as B, Al, Ga, or In, increased dopant concentration may lead to lower threshold voltage for the p-type FET. On the other hand, if the dopant in the first semiconductor layers 106 are n-type dopants, such as P or As, increased dopant concentration may lead to higher threshold voltage for the n-type FET.

As described above, difference compositions of the first semiconductor layers 106 lead to different threshold voltages in a single transistor. In some embodiments, the dimensions of the first semiconductor layers 106 can also lead to different threshold voltages. For example, in some embodiments, the first semiconductor layer 106a has a first thickness, the first semiconductor layer 106b has a second thickness about 50 percent to about 150 percent greater than the first thickness, and the first semiconductor layer 106c has a third thickness about 50 percent to about 150 percent greater than the second thickness. For example, the first thickness ranges from about 2 nm to about 4 nm, the second thickness ranges from about 5 nm to about 7 nm, and the third thickness ranges from about 8 nm to about 10 nm. In some embodiments, the ratio of the second thickness to the first thickness ranges from about 1.5 to about 2.5, and the ratio of the third thickness to the second thickness ranges from about 1.5 to about 2.5. In some embodiments, the first thickness is about 50 percent to about 150 percent greater than the second thickness, which is about 50 percent to about 150 percent greater than the third thickness. For example, the first thickness ranges from about 8 nm to about 10 nm, the second thickness ranges from about 5 nm to about 7 nm, and the third thickness ranges from about 2 nm to about 4 nm. In some embodiments, the ratio of the first thickness to the second thickness ranges from about 1.5 to about 2.5, and the ratio of the second thickness to the third thickness ranges from about 1.5 to about 2.5. Similar to the differences in composition of the first semiconductor layers 106, if the difference in thickness is too small, such as less than about 50 percent, the two first semiconductor layers 106 (106a/106b or 106b/106c) may be electrically conductive when one voltage is applied thereto. On the other hand, if the difference in thickness is too large, such as greater than about 150 percent, voltages applied to cause the thicker first semiconductor layers 106 to be conductive may be unnecessarily too large. The first semiconductor layers 106a, 106b, 106c may include the same material or include different materials.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes. While three first semiconductor layers 106 and three second semiconductor layers 108 are alternately arranged as illustrated in FIG. 1, it can be appreciated that any number of first and second semiconductor layers 106, 108 can be formed in the stack of semiconductor layers 104, depending on the predetermined number of nanostructure channels for each FET. For example, the number of first semiconductor layers 106, which is the number of channels, may be between 2 and 8. In some embodiments, the first semiconductor layers 106 include different compositions, and the FET has 2 to 8 threshold voltages. In some embodiments, as shown in FIG. 1, the first semiconductor layer 106a is disposed over the first semiconductor layer 106b, which is disposed over the first semiconductor layer 106c. The arrangement of the first semiconductor layers 106 is not limited to the arrangement shown in FIG. 1. For example, in some embodiments, the first semiconductor layer 106c is disposed over the first semiconductor layer 106b, which is disposed over the first semiconductor layer 106a.

Figure 2:
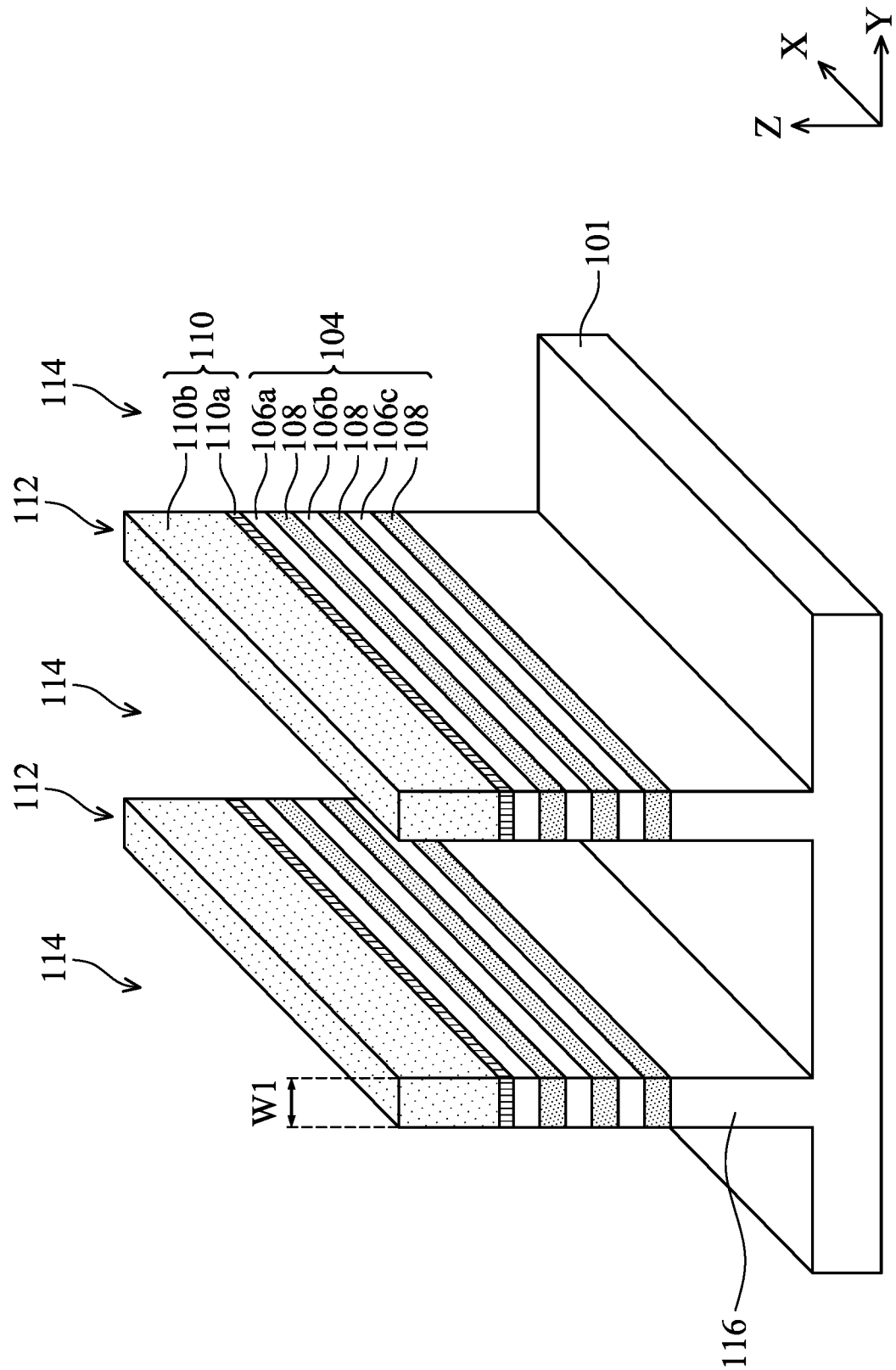

In FIG. 2, fin structures 112 are formed from the stack of semiconductor layers 104. Each fin structure 112 has a portion including the semiconductor layers 106, 108, a well portion 116 formed from the substrate 101, and a portion of a mask structure 110. The mask structure 110 is formed over the stack of semiconductor layers 104 prior to forming the fin structures 112. The mask structure 110 may include a pad layer 110a and a hard mask 110b. The pad layer 110a may be an oxygen-containing layer, such as a $SiO_2$ layer. The hard mask 110b may be a nitrogen-containing layer, such as a $Si_3N_4$ layer. The mask structure 110 may be formed by any suitable deposition process, such as chemical vapor deposition (CVD) process.

The fin structures 112 may be fabricated using suitable processes including photolithography and etch processes. In some embodiments, the photolithography process may include forming a photoresist layer (not shown) over the mask structure 110, exposing the resist to a pattern, performing post-exposure bake processes, and developing the resist to form a patterned resist. The patterned resist may then be used to protect regions of the substrate 101 and layers formed thereupon, while an etch process forms trenches 114 in unprotected regions through the mask structure 110, the stack of semiconductor layers 104, and into the substrate 101, thereby forming the extending fin structures 112. A width W1 of the fin structures 112 along the Y direction is in a range between about 3 nm and about 44 nm. In some embodiments, the width W1 of the fin structures 112 along the Y direction is in a range between about 20 nm and about 30 nm. The trenches 114 may be etched using a dry etch (e.g., RIE), a wet etch, and/or combination thereof. While two fin structures 112 are shown, the number of the fin structures is not limited to two.

Figure 3:
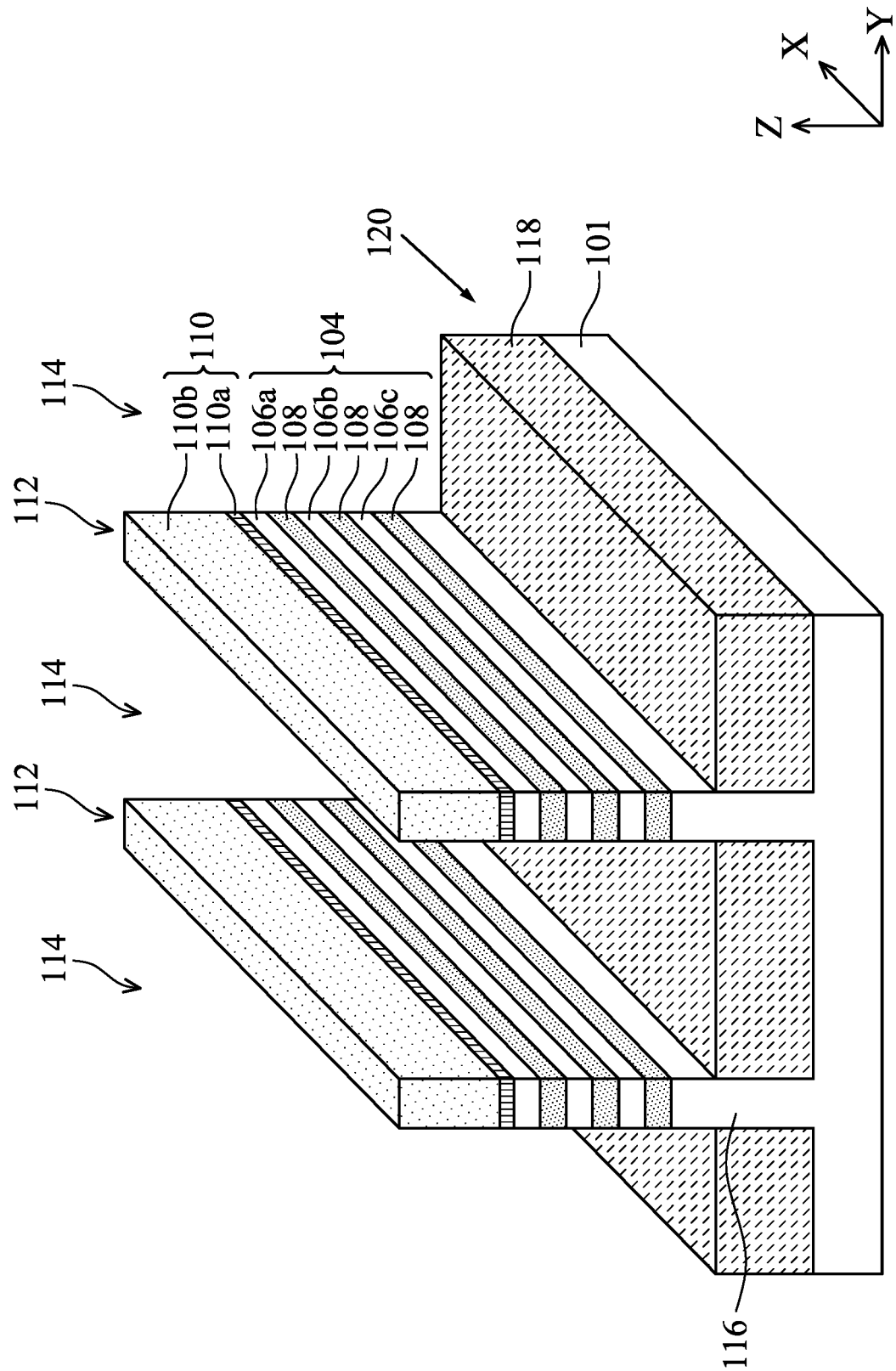

In FIG. 3, after the fin structures 112 are formed, an insulating material 118 is formed in the trenches 114 between the fin structures 112. The insulating material 118 fills the trenches 114 between neighboring fin structures 112 until the fin structures 112 are embedded in the insulating material 118. Then, a planarization operation, such as a chemical mechanical polishing (CMP) process and/or an etch-back process, is performed to expose the top of the fin structures 112. The insulating material 118 may be made of silicon oxide, silicon nitride, silicon oxynitride (SiON), SiOCN, SiCN, fluorine-doped silicate glass (FSG), a low-k dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Next, the insulating material 118 is recessed to form an isolation region 120. The recess of the insulating material 118 exposes portions of the fin structures 112. The isolation region 120 may be formed using a suitable process, such as a dry etching process, a wet etching process, or a combination thereof. A top surface of the insulating material 118 may be level with or below a surface of the second semiconductor layers 108 in contact with the well portion 116.

Figure 4:
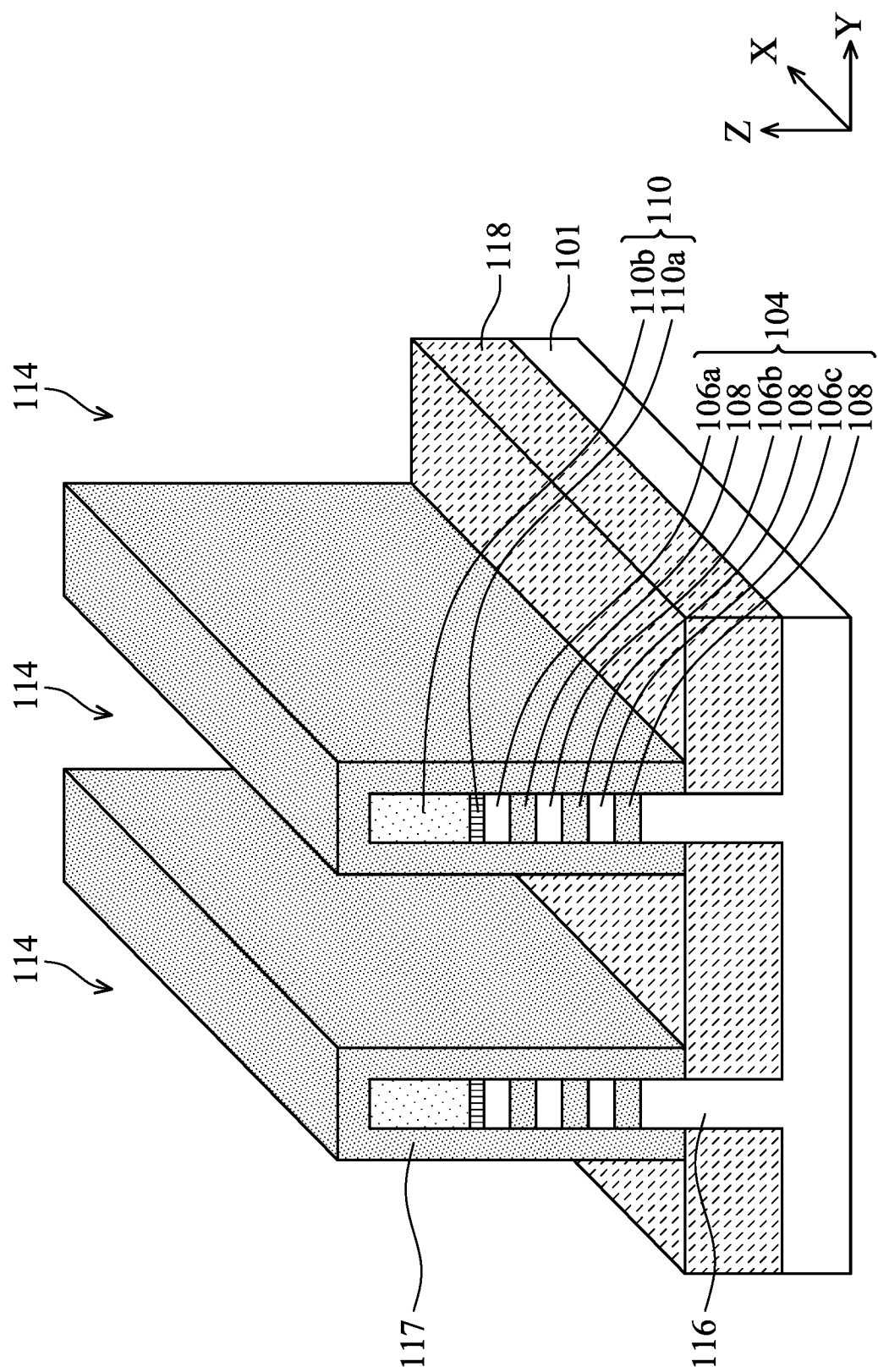

In FIG. 4, a cladding layer 117 is formed by an epitaxial process over exposed portion of the fin structures 112. In some embodiments, a semiconductor liner (not shown) may be first formed over the fin structures 112, and the cladding layer 117 is then formed over the semiconductor liner. The semiconductor liner may be diffused into the cladding layer 117 during the formation of the cladding layer 117. In either case, the cladding layer 117 is in contact with the stack of semiconductor layers 104. In some embodiments, the cladding layer 117 and the second semiconductor layers 108 include the same material having the same etch selectivity. For example, the cladding layer 117 and the second semiconductor layers 108 may be or include SiGe. The cladding layer 117 and the second semiconductor layers 108 may be removed subsequently to create space for the gate electrode layer.

Figure 5:
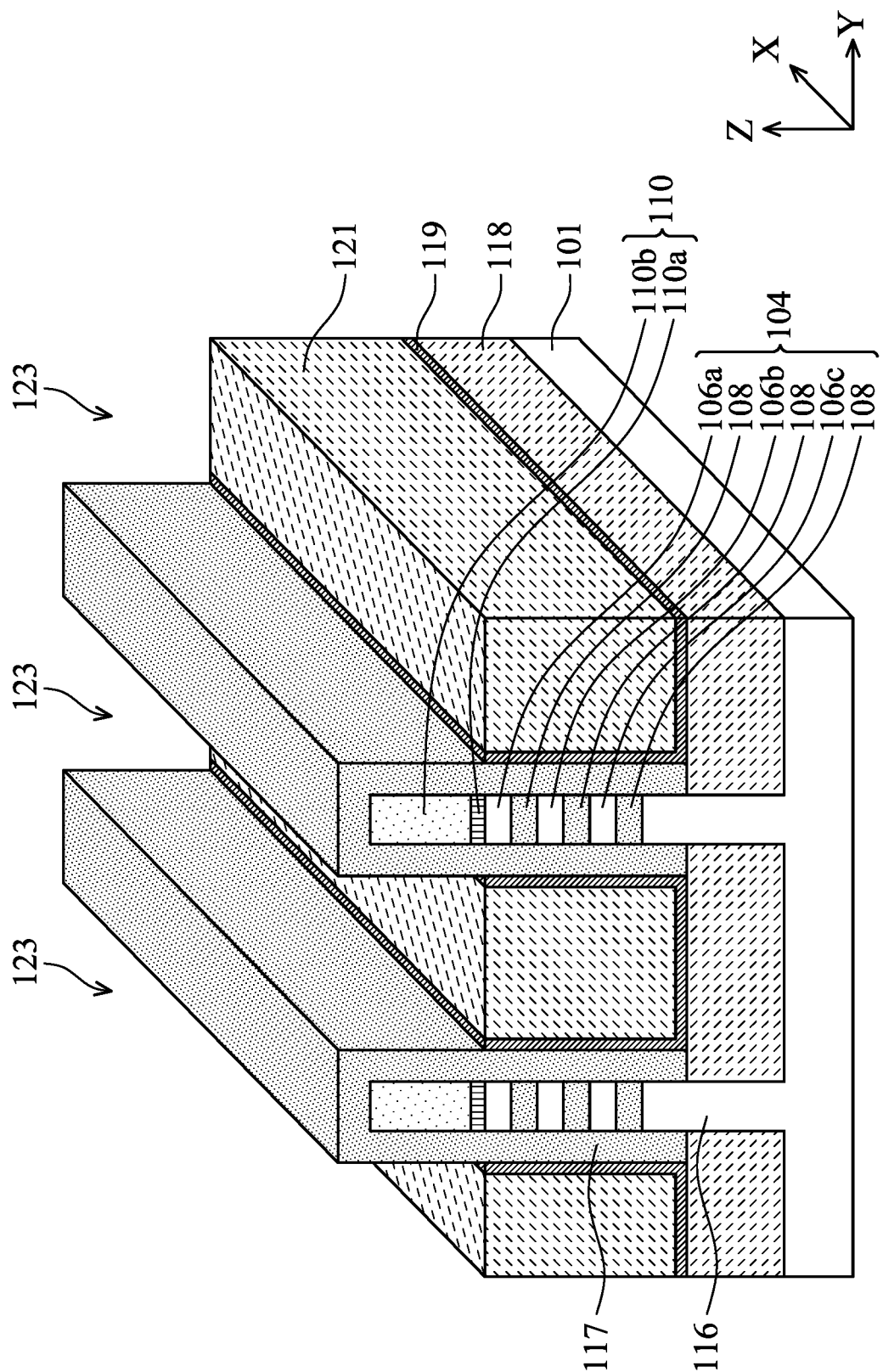

In FIG. 5, a liner 119 is formed on the cladding layer 117 and the top surface of the insulating material 118. The liner 119 may include a material having a k value lower than 7, such as $SiO_2$, SiN, SiCN, SiOC, or SiOCN. The liner 119 may be formed by a conformal process, such as an ALD process. A dielectric material 121 is then formed in the trenches 114 (FIG. 4) and on the liner 119. The dielectric material 121 may be an oxygen-containing material, such as an oxide, formed by FCVD. The oxygen-containing material may have a k value less than about 7, for example less than about 3. A planarization process, such as a CMP process, may be performed to remove portions of the liner 119 and the dielectric material 121 formed over the fin structures 112. The portion of the cladding layer 117 disposed on the hard mask 110b is exposed after the planarization process.

Next, the liner 119 and the dielectric material 121 are recessed to the level of the topmost first semiconductor layer 106. For example, in some embodiments, after the recess process, the top surfaces of the liner 119 and the dielectric material 121 may be level with a top surface of the first semiconductor layer 106a. The recess processes may be selective etch processes that do not substantially affect the semiconductor material of the cladding layer 117. As a result of the recess process, trenches 123 are formed between the fin structures 112.

Figure 6:
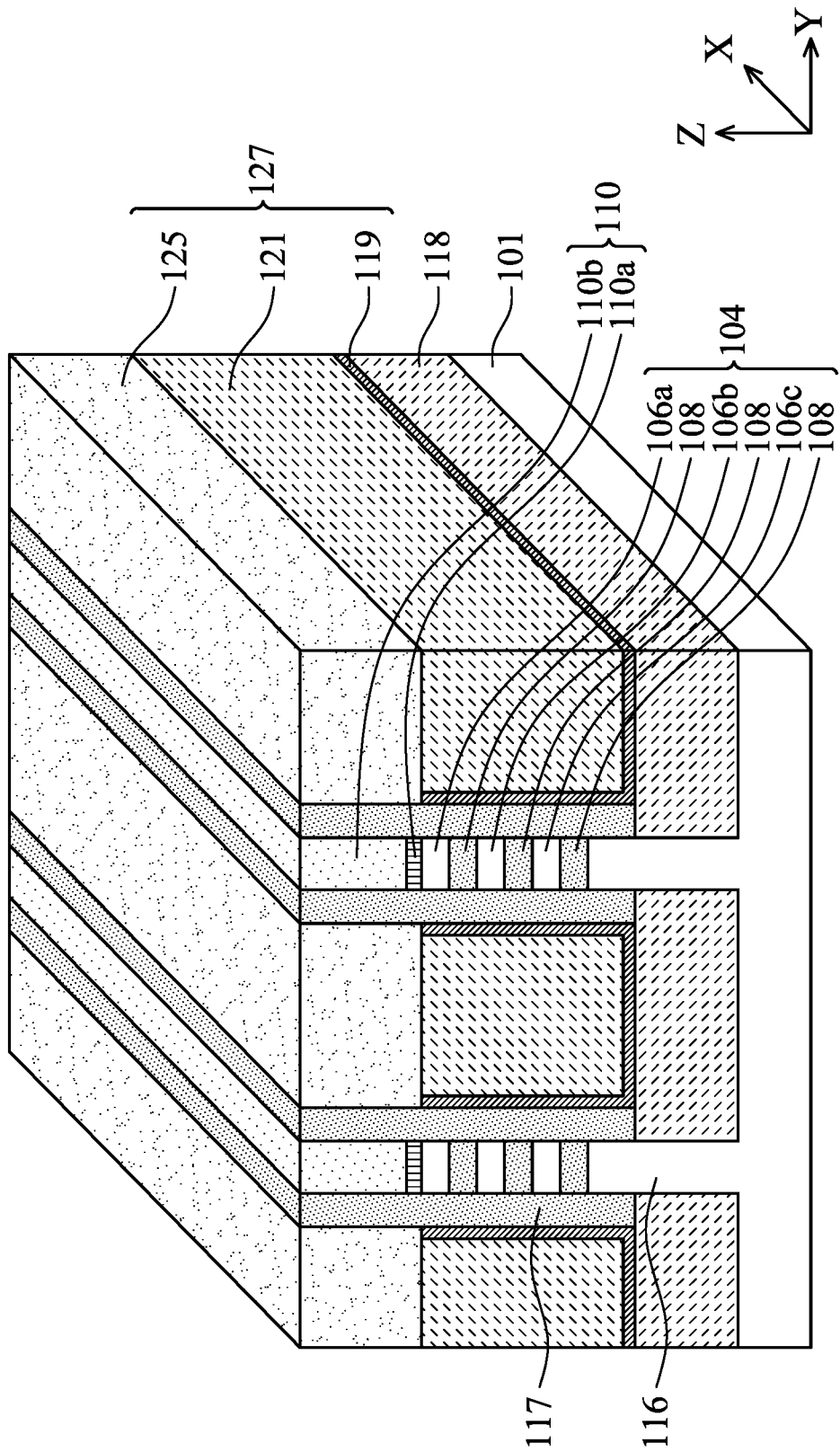

In FIG. 6, a dielectric material 125 is formed in the trenches 123 (FIG. 5) and on the dielectric material 121 and the liner 119. The dielectric material 125 may include SiO, SiN, SiC, SiCN, SiON, SiOCN, AlO, AN, AlON, ZrO, ZrN, ZrAlO, HfO, or other suitable dielectric material. In some embodiments, the dielectric material 125 includes a high-k dielectric material (e.g., a material having a k value greater than 7). The dielectric material 125 may be formed by any suitable process, such as a CVD, PECVD, FCVD, or ALD process. A planarization process, such as a CMP process, is performed until the hard mask 110b of the mask structure 110 is exposed. The planarization process removes portions of the dielectric material 125 and the cladding layer 117 disposed over the mask structure 110. The liner 119, the dielectric material 121, and the dielectric material 125 together may be referred to as a dielectric feature 127 or a hybrid fin. The dielectric feature 127 serves to separate subsequent formed source/drain (S/D) epitaxial features and adjacent gate electrode layers.

Figure 7:
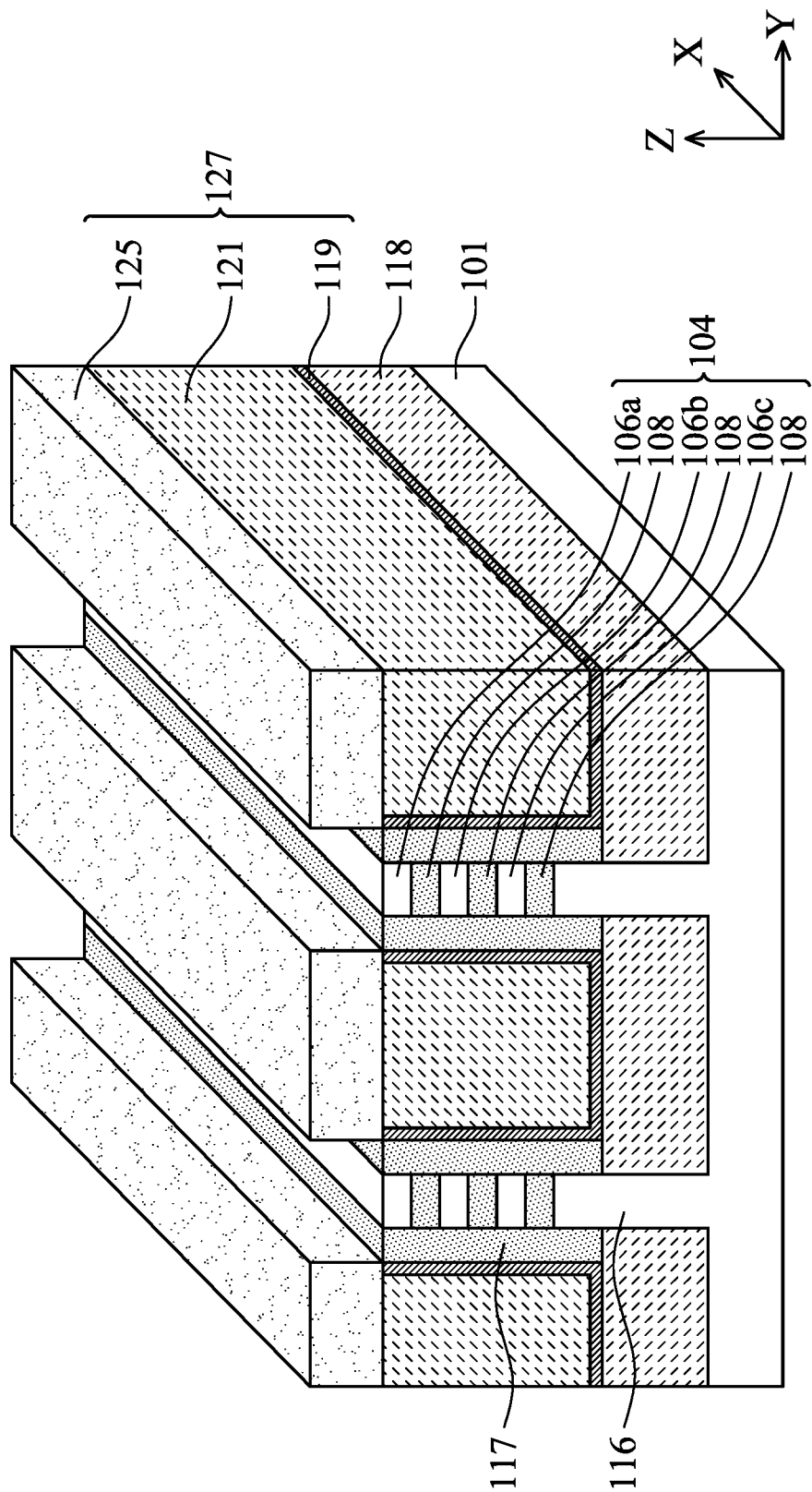

In FIG. 7, the cladding layers 117 are recessed, and the mask structures 110 are removed. The recess of the cladding layers 117 may be performed by any suitable process, such as dry etch, wet etch, or a combination thereof. The recess process may be controlled so that the remaining cladding layers 117 are substantially at the same level as the top surface of the first semiconductor layer 106a in the stack of semiconductor layers 104. The etch process may be a selective etch process that does not substantially affect the dielectric material 125. The removal of the mask structures 110 may be performed by any suitable process, such as dry etch, wet etch, or a combination thereof.

Figure 8:
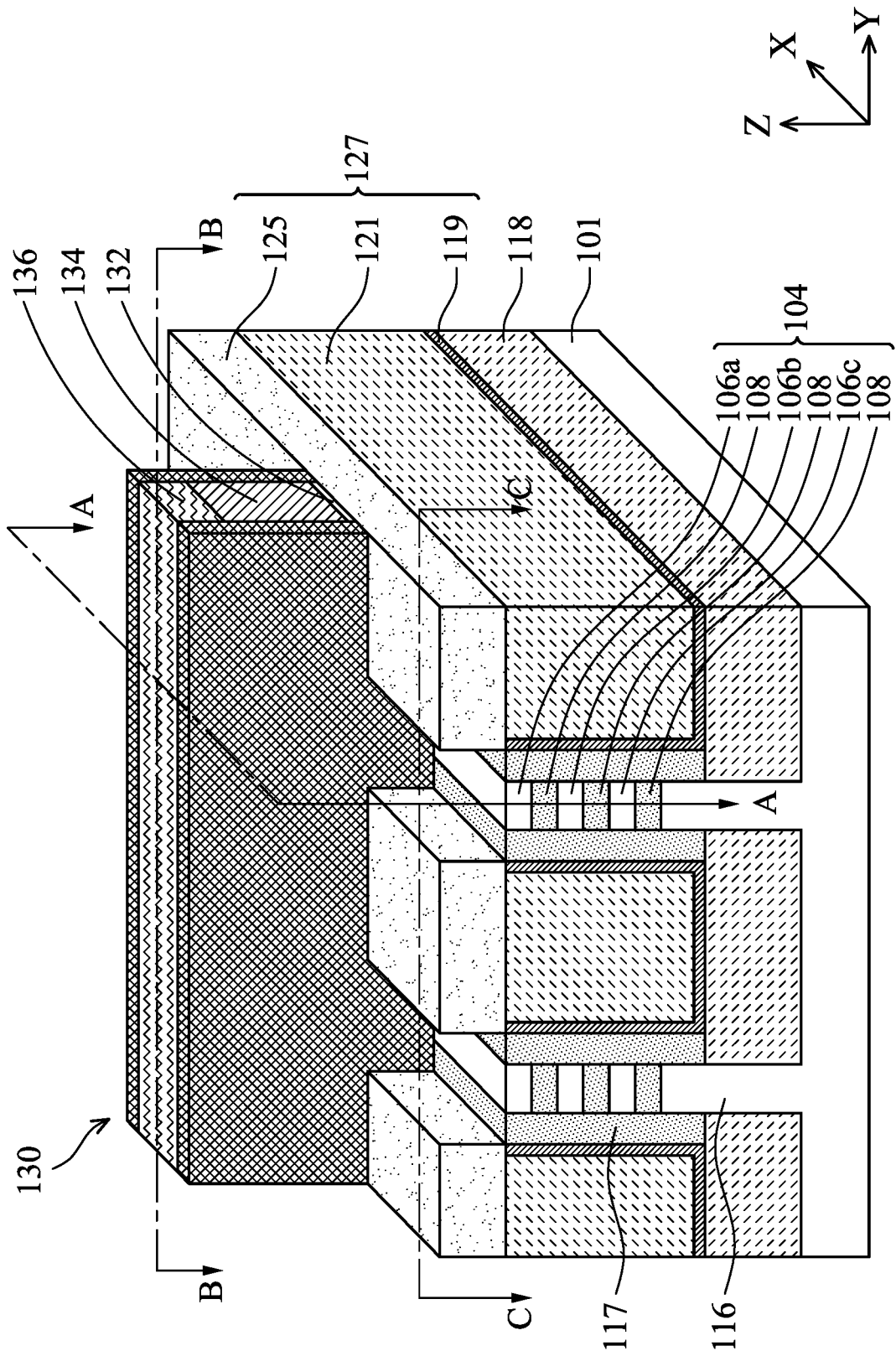

In FIG. 8, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof.

By patterning the sacrificial gate structure 130, the stacks of semiconductor layers 104 of the fin structures 112 are partially exposed on opposite sides of the sacrificial gate structure 130. The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. While one sacrificial gate structure 130 is shown, two or more sacrificial gate structures 130 may be arranged along the X direction in some embodiments.

Next, gate spacers 138 are formed on sidewalls of the sacrificial gate structures 130. The gate spacers 138 may be formed by first depositing a conformal layer that is subsequently etched back to form sidewall gate spacers 138. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fin structures 112, the cladding layer 117, the dielectric material 125, leaving the gate spacers 138 on the vertical surfaces, such as the sidewalls of sacrificial gate structures 130. The gate spacer 138 may be made of a dielectric material such as silicon oxide, silicon nitride, silicon carbide, silicon oxynitride, SiCN, silicon oxycarbide, SiOCN, and/or combinations thereof.

In some embodiments, the cladding layers 117 and the dielectric features 127 are not present, and the sacrificial gate structures 130 and the gate spacers 138 are formed on the insulating material 118, and gaps are formed between exposed portions of the fin structures 112.

FIGS. 9A-13A are cross-sectional side views of various stages of manufacturing the semiconductor device structure 100 taken along cross-section A-A of FIG. 8, in accordance with some embodiments. FIGS. 9B-13B are cross-sectional side views of various stages of manufacturing the semiconductor device structure 100 taken along cross-section B-B of FIG. 8, in accordance with some embodiments. FIGS. 9C-13C are cross-sectional side views of various stages of manufacturing the semiconductor device structure 100 taken along cross-section C-C of FIG. 8, in accordance with some embodiments. Cross-section A-A is in a plane of the fin structure 112 along the X direction. Cross-section B-B is in a plane perpendicular to cross-section A-A and is in the sacrificial gate structure 130. Cross-section C-C is in a plane perpendicular to cross-section A-A and is in the S/D epitaxial features 146 (FIG. 11C) along the Y-direction.

In FIGS. 9A-9C, exposed portions of the fin structures 112, exposed portions of the cladding layers 117, and exposed portions of the dielectric material 125 not covered by the sacrificial gate structures 130 and the gate spacers 138 are selectively recessed by using one or more suitable etch processes, such as dry etch, wet etch, or a combination thereof. In some embodiments, exposed portions of the stacks of semiconductor layers 104 of the fin structures 112 are removed, exposing portions of the well portions 116. As shown in FIG. 9A, the exposed portions of the fin structures 112 are recessed to a level at or slightly below the bottom surface of the second semiconductor layer 108 in contact with the well portion 116 of the substrate 101. The recess processes may include an etch process that recesses the exposed portions of the fin structures 112 and the exposed portions of the cladding layers 117.

In FIGS. 10A-10C, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon and/or SiGe having lower germanium concentration than the second semiconductor layers 108, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

In FIGS. 11A-11C, S/D epitaxial features 146 are formed on the well portion 116 of the fin structures 112. The S/D epitaxial feature 146 may include one or more layers of Si, SiP, SiC and SiCP for an n-type FET or Si, SiGe, Ge for a p-type FET. The S/D epitaxial features 146 may grow both vertically and horizontally to form facets, which may correspond to crystalline planes of the material used for the substrate 101. The S/D epitaxial features 146 are formed by an epitaxial growth method using CVD, ALD or MBE. The S/D epitaxial features 146 are in contact with the first semiconductor layers 106 and dielectric spacers 144. The S/D epitaxial features 146 may be the S/D regions. For example, one of a pair of S/D epitaxial features 146 located on one side of the sacrificial gate structures 130 may be a source region, and the other of the pair of S/D epitaxial features 146 located on the other side of the sacrificial gate structures 130 may be a drain region. A pair of S/D epitaxial features 146 includes a source epitaxial feature 146 and a drain epitaxial feature 146 connected by the channels (i.e., the first semiconductor layers 106). In this disclosure, a source and a drain are interchangeably used, and the structures thereof are substantially the same.

In FIGS. 12A-12C, after formation of the S/D epitaxial features 146, a contact etch stop layer (CESL) 162 is conformally formed on the exposed surfaces of the semiconductor device structure 100. The CESL 162 covers the S/D epitaxial features 146, the gate spacers 138, and the dielectric material 125. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include oxide formed with tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials comprising Si, O, C, and/or H. The ILD layer 164 may be deposited by a PECVD process or other suitable deposition technique. In some embodiments, after formation of the ILD layer 164, the semiconductor device structure 100 may be subject to a thermal process to anneal the ILD layer 164.

Next, a planarization operation, such as CMP, is performed on the semiconductor device structure 100 to remove portions of the ILD layer 164, the CESL 162, and the mask layer 136 until the sacrificial gate electrode layer 134 is exposed, as shown in FIGS. 12A and 12B.

In FIGS. 13A-13C, the sacrificial gate structure 130, the cladding layer 117, and the second semiconductor layers 108 are removed. The removal of the sacrificial gate structure 130 and the semiconductor layers 108 forms an opening 166 between gate spacers 138 and between first semiconductor layers 106. The ILD layer 164 protects the S/D epitaxial features 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric material 125, the ILD layer 164, and the CESL 162. In some embodiments, the gate spacers 138 may be recessed by the etchant used to remove the sacrificial gate electrode layer 134 and/or the sacrificial gate dielectric layer 132.

After the removal of the sacrificial gate structure 130, the cladding layers 117 are exposed. The removal of the cladding layers 117 and the second semiconductor layers 108 exposes the dielectric spacers 144 and the first semiconductor layers 106. The removal process may be any suitable etch processes, such as dry etch, wet etch, or a combination thereof. The etch process may be a selective etch process that removes the cladding layers 117 and the second semiconductor layers 108 but not the gate spacers 138, the ILD layer 164, the CESL 162, the dielectric material 125, and the first semiconductor layers 106. As a result, a portion of the first semiconductor layers 106 not covered by the dielectric spacers 144 is exposed in the opening 166.

Figure 14:
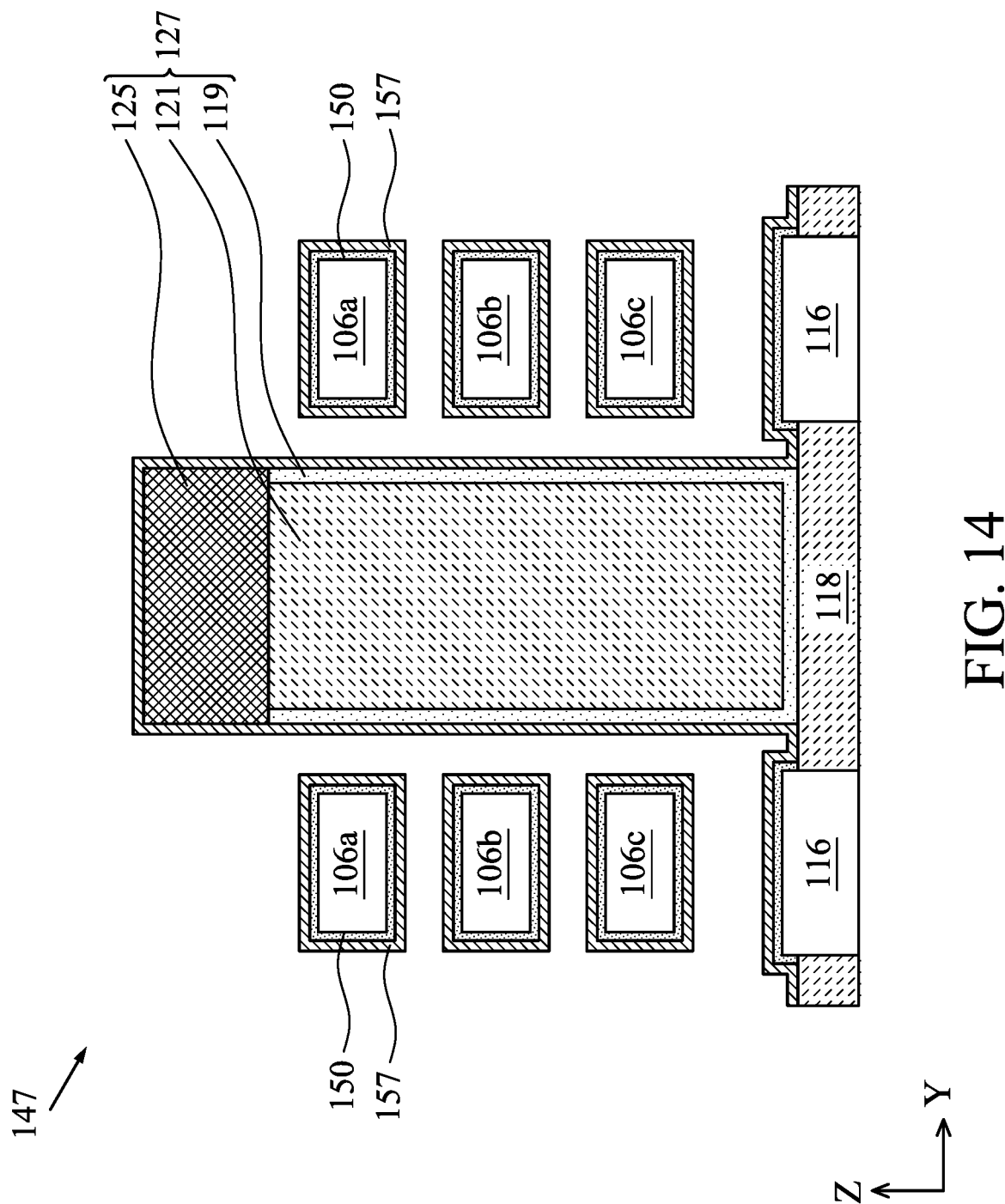
FIGS. 14-25 are enlarged views of a region of FIG. 13B showing various stages of manufacturing the semiconductor device structure, in accordance with some embodiments.
Figure 15:
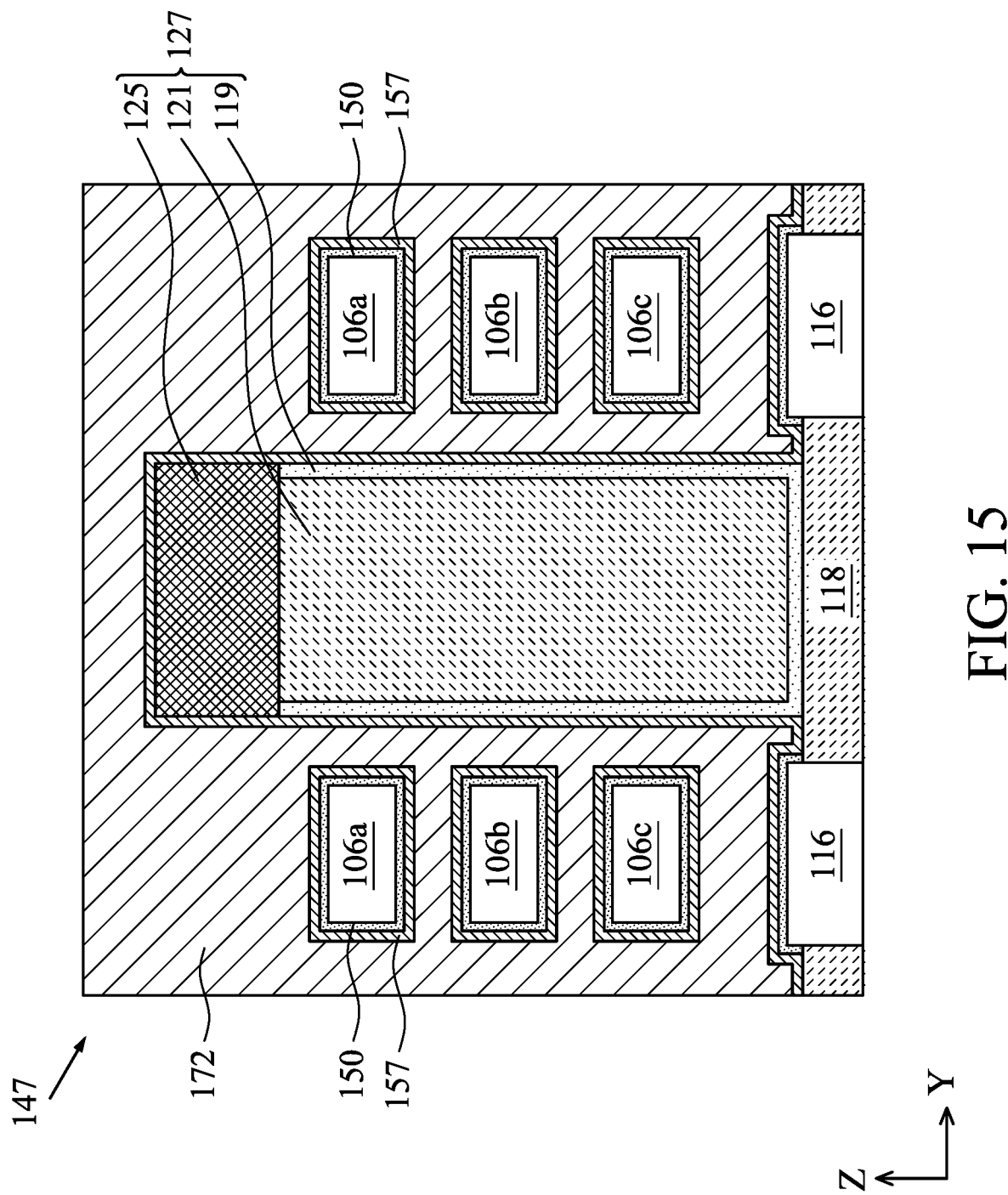
Figure 16:
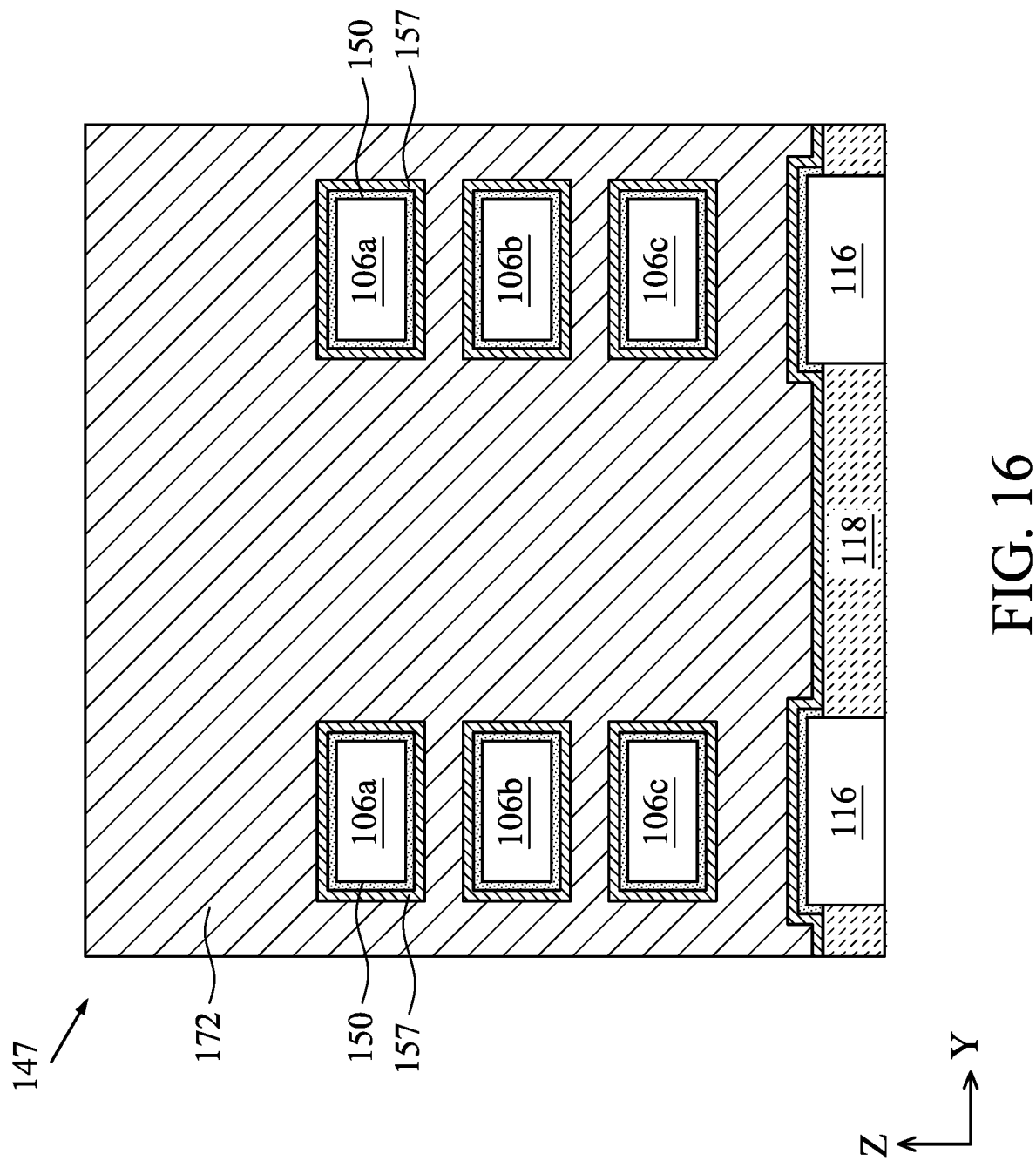

FIGS. 14-16 are enlarged views of a region 147 of FIG. 13B showing various stages of manufacturing the semiconductor device structure 100, in accordance with some embodiments. In FIG. 14, an interfacial layer (IL) 150 is formed to surround the exposed surfaces of the first semiconductor layers 106. In some embodiments, the IL 150 may also form on the well portion 116 of the substrate 101. The IL 150 may include or be made of an oxygen-containing material or a silicon-containing material, such as silicon oxide, silicon oxynitride, oxynitride, hafnium silicate, etc. In one embodiment, the IL 150 is silicon oxide. The IL 150 may be formed by CVD, ALD, a clean process, or any suitable process.

A gate dielectric layer 157 is formed on the exposed surfaces of the semiconductor device structure 100. In some embodiments, the gate dielectric layer 157 is formed to wrap around and in contact with the IL 150. The gate dielectric layer 157 also forms on and in contact with the liner 119 and the dielectric material 125. The gate dielectric layer 160 may include or made of a high-k dielectric material, such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. The gate dielectric layer 157 may be a conformal layer formed by a conformal process, such as an ALD process or a CVD process.

In FIG. 15, a gate electrode layer 172 is formed on the gate dielectric layer 157. The gate electrode layer 172 fills the opening 166 and surrounds a portion of each of the first semiconductor layers 106. The gate electrode layer 172 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The gate electrode layers 172 may be formed by PVD, CVD, ALD, electro-plating, or other suitable method. The gate electrode layer 172 may be recessed to a level below the top surface of the dielectric feature 127, and the dielectric feature 127 functions to separate the gate electrode layer 172 into two gate electrode layers 172.

As described above, in alternative embodiments, the dielectric feature 127 may not be present, as shown in FIG. 16. In such embodiments, the gate electrode layer 172 surrounds two or more groups of the first semiconductor layers 106.

Figure 17:
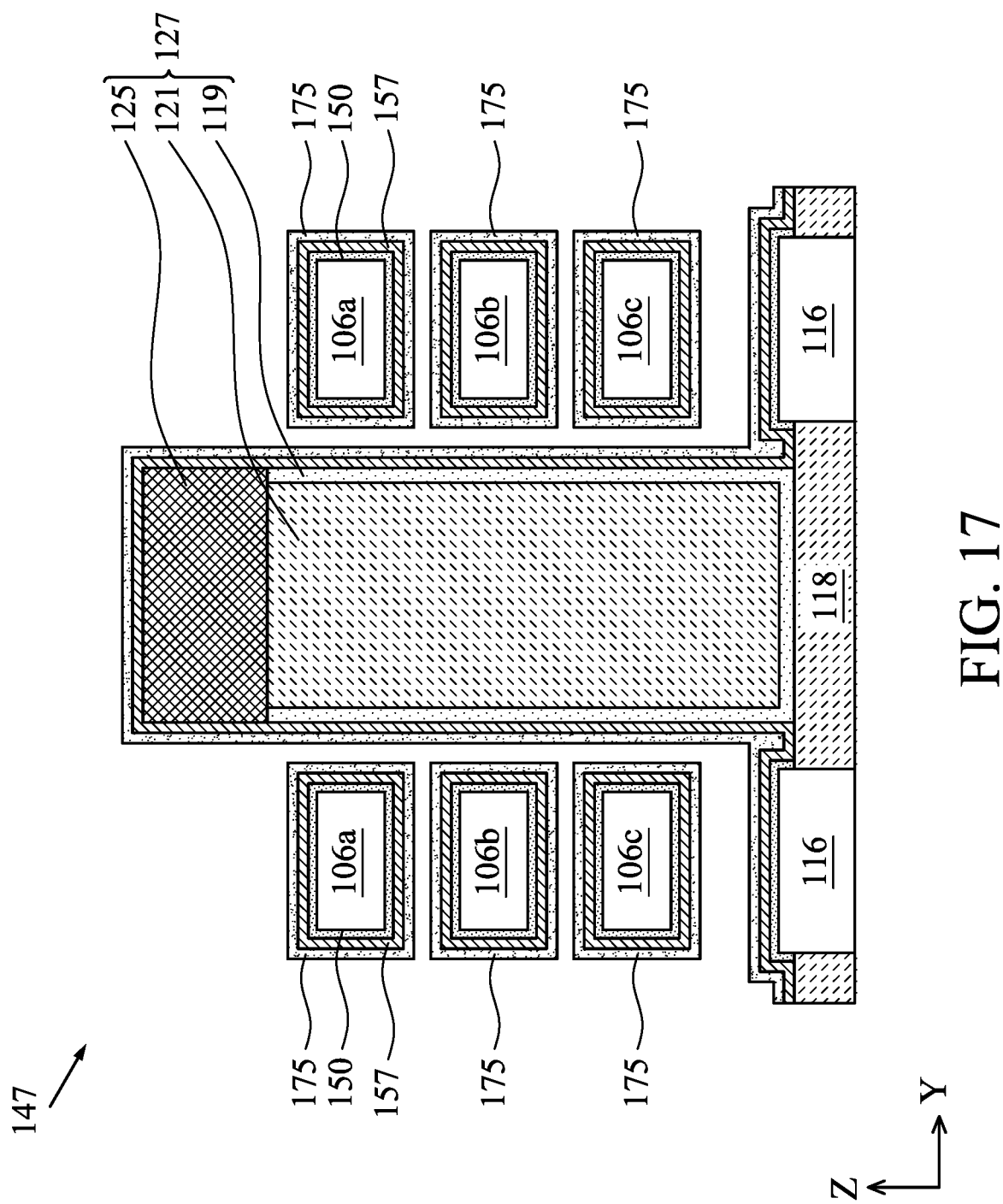
Figure 25:
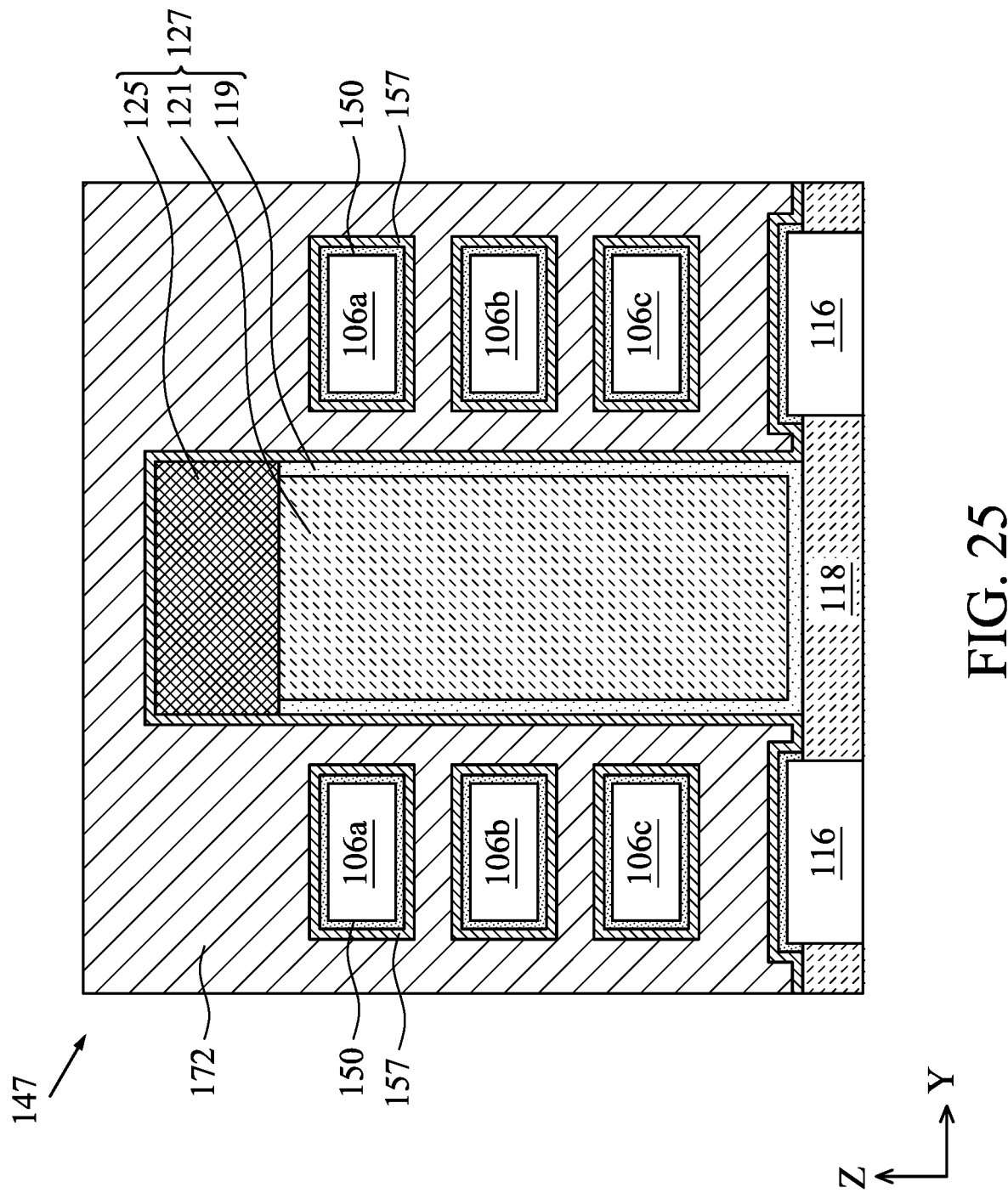

FIGS. 17 and 25 are enlarged views of a region 147 of FIG. 13B showing various stages of manufacturing the semiconductor device structure 100, in accordance with alternative embodiments. In some embodiments, the first semiconductor layers 106a, 106b, 106c include the same material at the stage of forming the first semiconductor layers 106a, 106b, 106c. As shown in FIG. 17, prior to forming the gate electrode layer 172, first dipole layers 175 are formed on the gate dielectric layer 157 to surround the first semiconductor layers 106. In some embodiments, the first dipole layer 175 may also form over the well portion 116 of the substrate 101 and the dielectric feature 127. Depending on the conductivity type of the nanostructure transistor, the first dipole layer 175 may be configured to include positive polarity or negative polarity. The nanostructure transistor on one side of the dielectric feature 127 may be designated as a p-type FET, and the nanostructure transistor on the other side of the dielectric feature 127 may be designated as an n-type FET. In any case, the first dipole layer 175 serves to change threshold voltage of the nanostructure transistor. In some embodiments, the first dipole layer 175 includes aluminum oxide ($Al_2O_3$), titanium dioxide ($TiO_2$), germanium oxide ($GeO_2$), lanthanum oxide ($La_2O_3$), magnesium oxide (MgO), yttrium oxide ($Y_2O_3$), gadolinium oxide ($Gd_2O_3$), or other suitable material.

Figure 18:
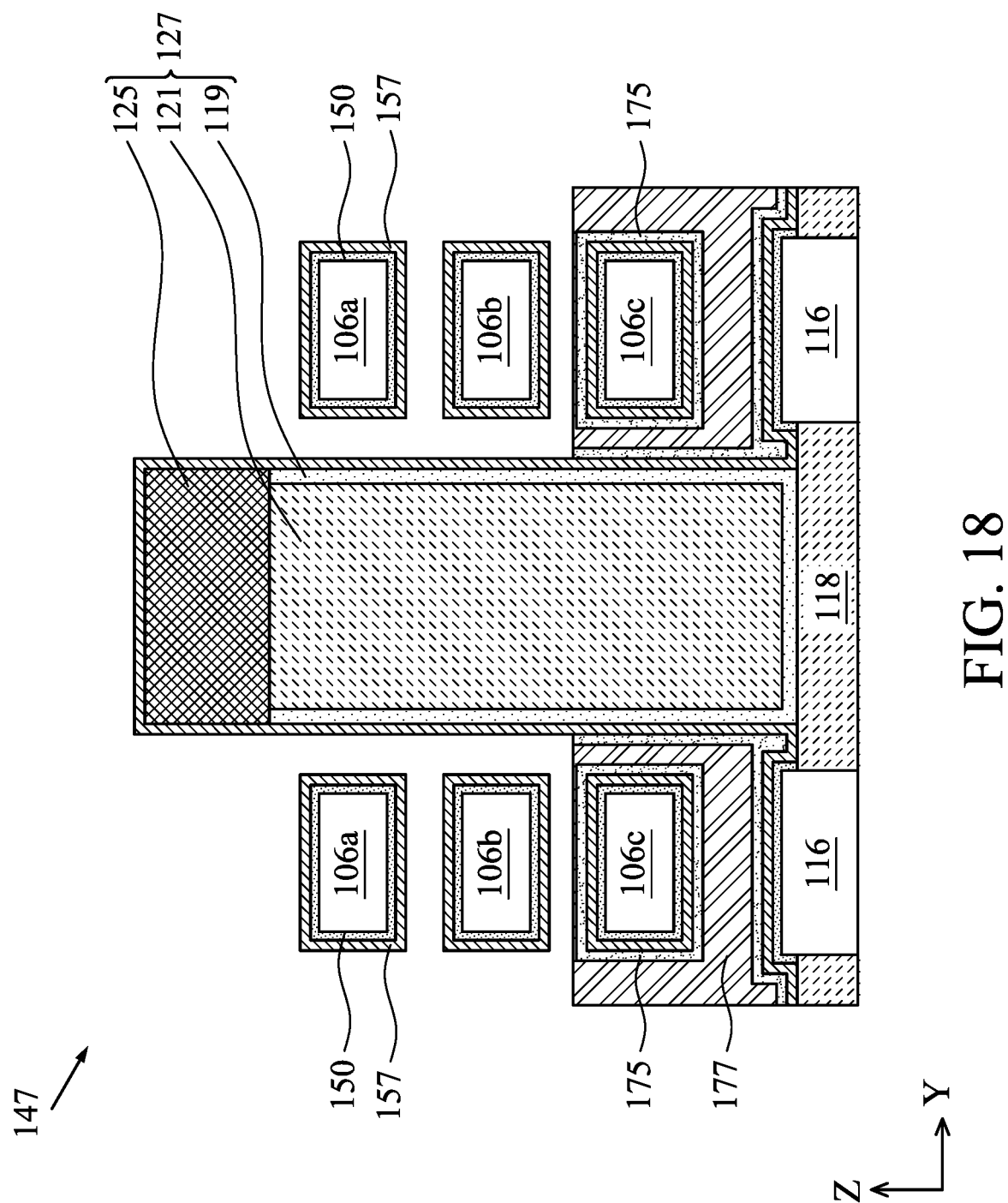

In FIG. 18, a sacrificial layer 177 is formed in the opening 166 to cover the first dipole layer 175 formed around the first semiconductor layers 106c. The sacrificial layer 177 may be formed to fill the opening 166 and followed by an etch back process to expose the first dipole layers 175 formed around the first semiconductor layers 106a, 106b. The sacrificial layer 177 may include any suitable material, such as a bottom antireflective coating (BARC) material, which may be a spin-on organic material or a spin-on carbon material. The exposed first dipole layers 175 formed around the first semiconductor layers 106a, 106b are removed, as shown in FIG. 18. The exposed portion of the first dipole layer 175 formed over the dielectric feature 127 is also removed. The removal may be any suitable process, such as a dry etch, wet etch, or a combination thereof. The removal process may be a selective etch process that does not substantially affect the gate dielectric layer 157.

Figure 19:
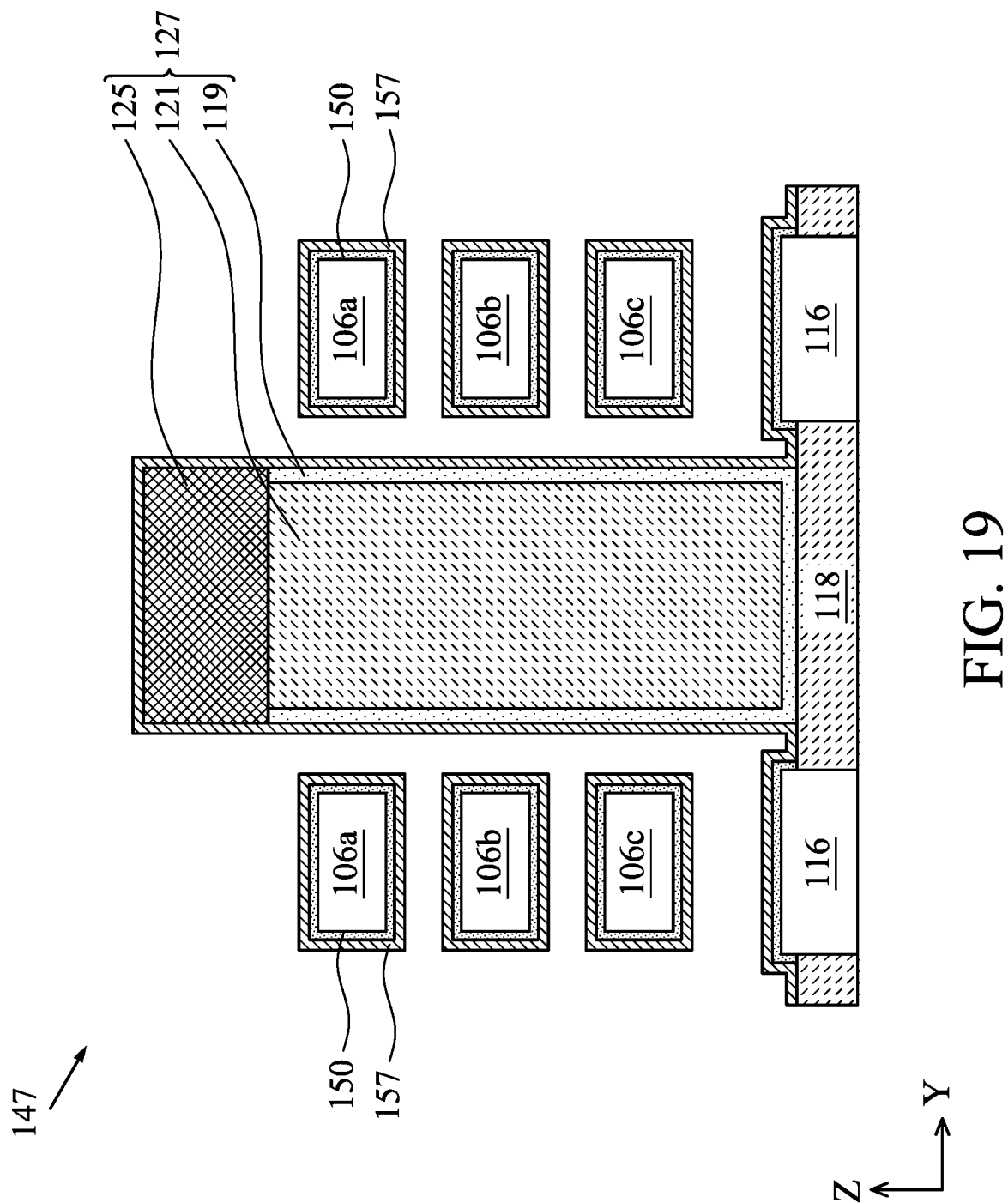

In FIG. 19, the remaining sacrificial layer 177 surrounding the first semiconductor layers 106c is removed by any suitable process, and an annealing process is performed to drive the materials from the first dipole layers 175 into the gate dielectric layers 157 surrounding the first semiconductor layers 106c. In some embodiments, the first dipole layers 175 includes a metal oxide or a semiconductor oxide, and metal or semiconductor atoms are diffused into the gate dielectric layers 157 surrounding the first semiconductor layers 106c by the annealing process. As a result of the annealing process, the gate dielectric layers 157 surrounding the first semiconductor layers 106c include a first concentration of the metal or the semiconductor. For example, the gate dielectric layers 157 surrounding the first semiconductor layers 106c includes a high-k dielectric material and about 1 atomic percent to about 10 atomic percent of the metal, such as Al or La. After the annealing process, a wet clean process is performed to remove the remaining first dipole layers 175.

Figure 20:
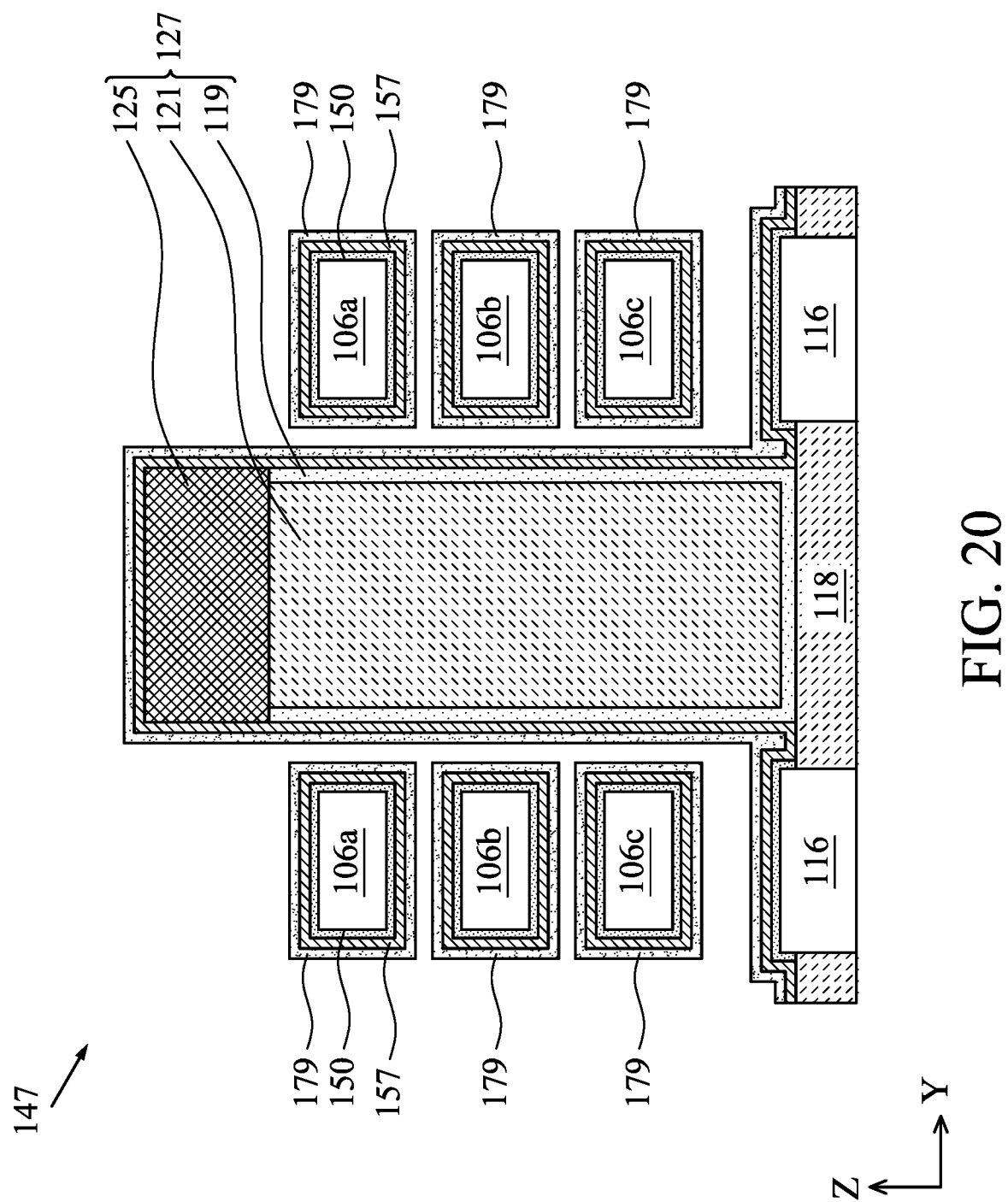

In FIG. 20, a second dipole layer 179 is formed on the gate dielectric layer 157 to surround the first semiconductor layers 106a, 106b, 106c. The second dipole layer 179 may include the same or different material as the first dipole layer 175. In some embodiments, the second dipole layer 179 includes the same material as the first dipole layer 175.

Figure 21:
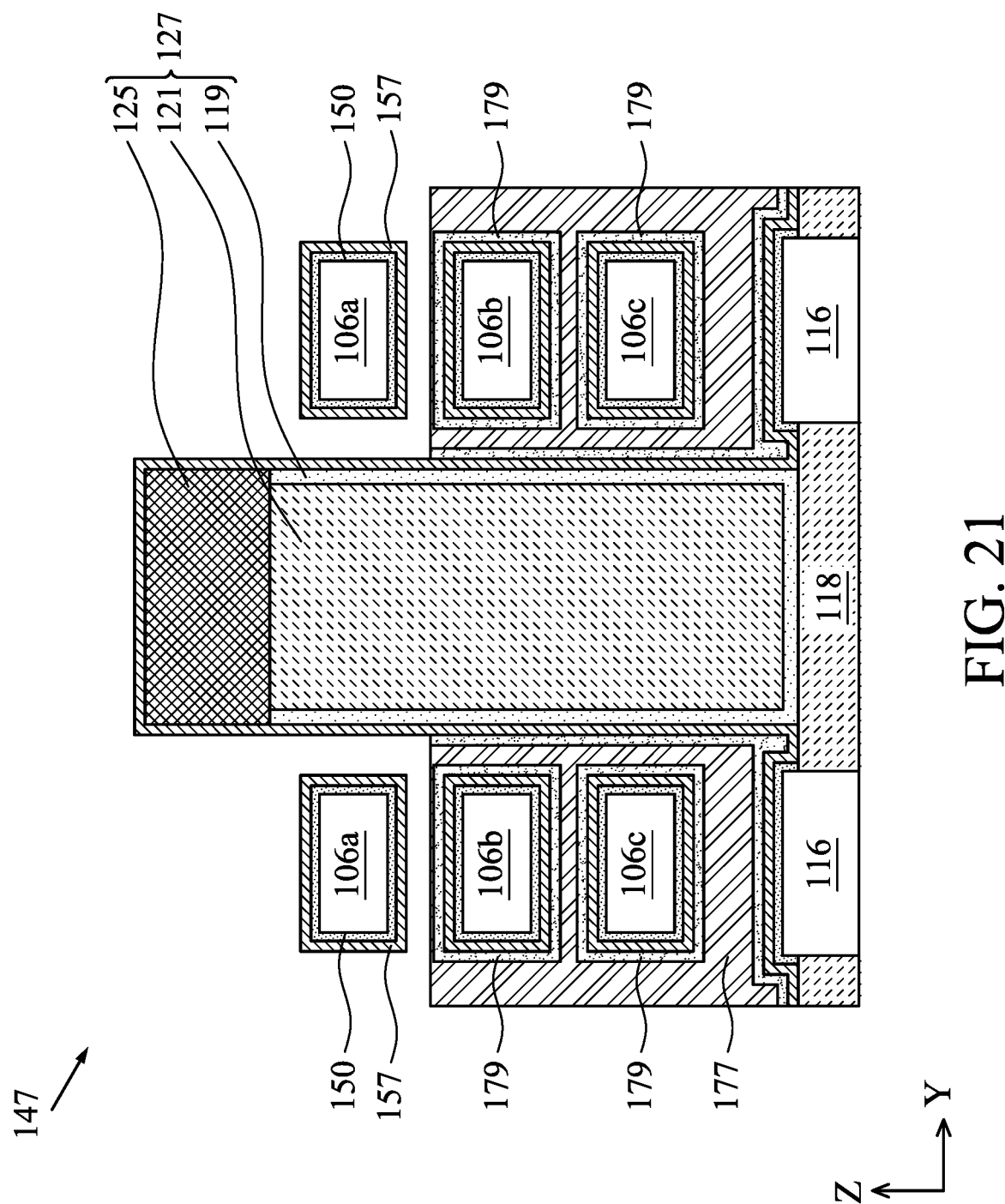
Figure 22:
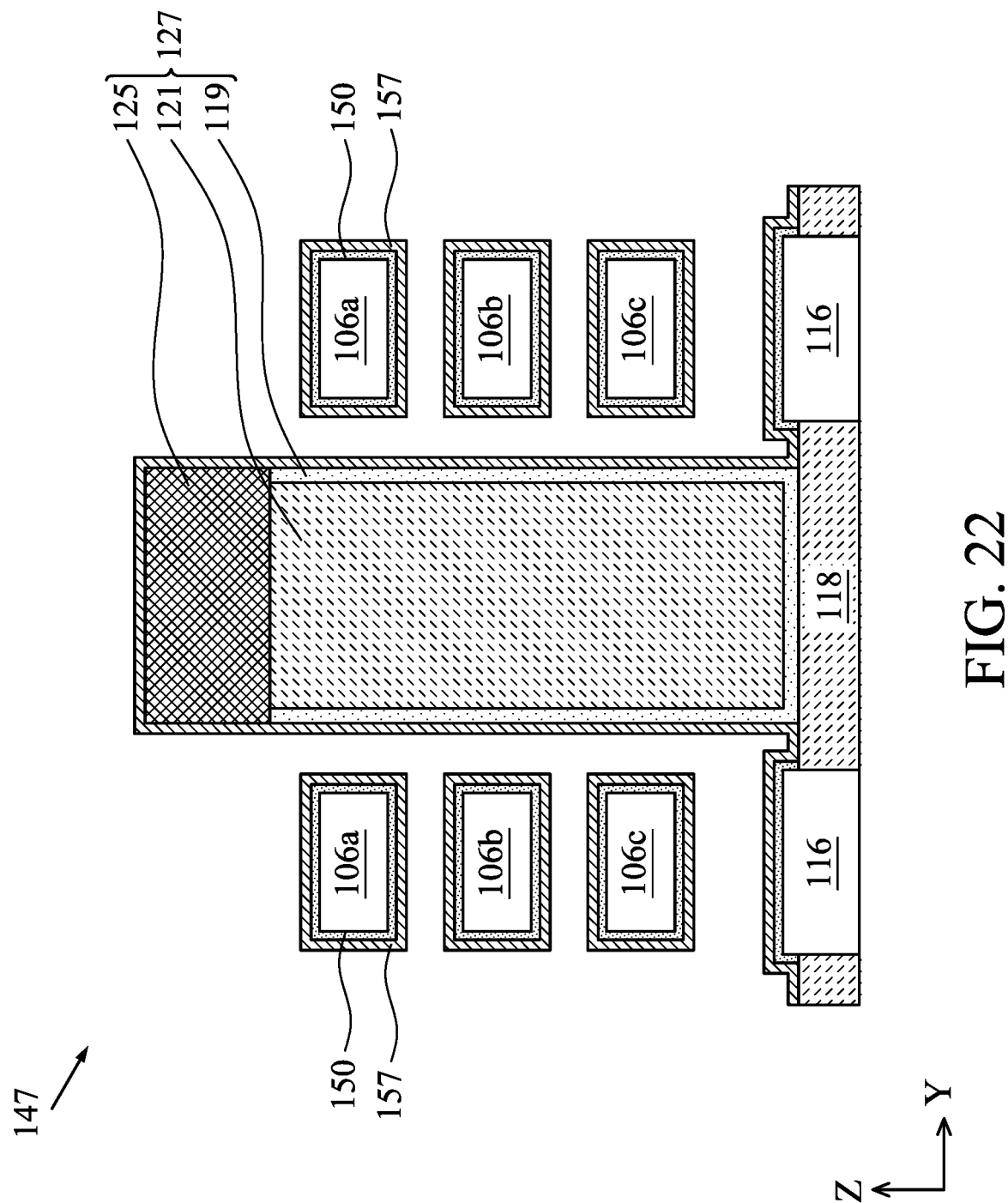

In FIG. 21, the sacrificial layer 177 is formed to cover the second dipole layers 179 formed around the gate dielectric layers 157 surrounding the first semiconductor layers 106b, 106c, and the second dipole layers 179 formed around the first semiconductor layers 106a are removed. Next, as shown in FIG. 22, the remaining sacrificial layer 177 surrounding the first semiconductor layers 106b, 106c is removed by any suitable process, and an annealing process is performed to drive the materials from the second dipole layers 179 into the gate dielectric layers 157 surrounding the first semiconductor layers 106b, 106c. As a result of the annealing process, the gate dielectric layers 157 surrounding the first semiconductor layers 106c include a second concentration of the metal or the semiconductor, and the gate dielectric layers 157 surrounding the first semiconductor layers 106b include a third concentration of the metal or the semiconductor. The second concentration is substantially greater than the third concentration, because the gate dielectric layers 157 surrounding the first semiconductor layers 106c already have the first concentration before the annealing process to drive the materials from the second dipole layers 179 into the gate dielectric layers 157 surrounding the first semiconductor layers 106b, 106c. In some embodiments, the second concentration is about 2 times to about 3 times greater than the third concentration. After the annealing process, a wet clean process is performed to remove the second dipole layers 179.

Figure 23:
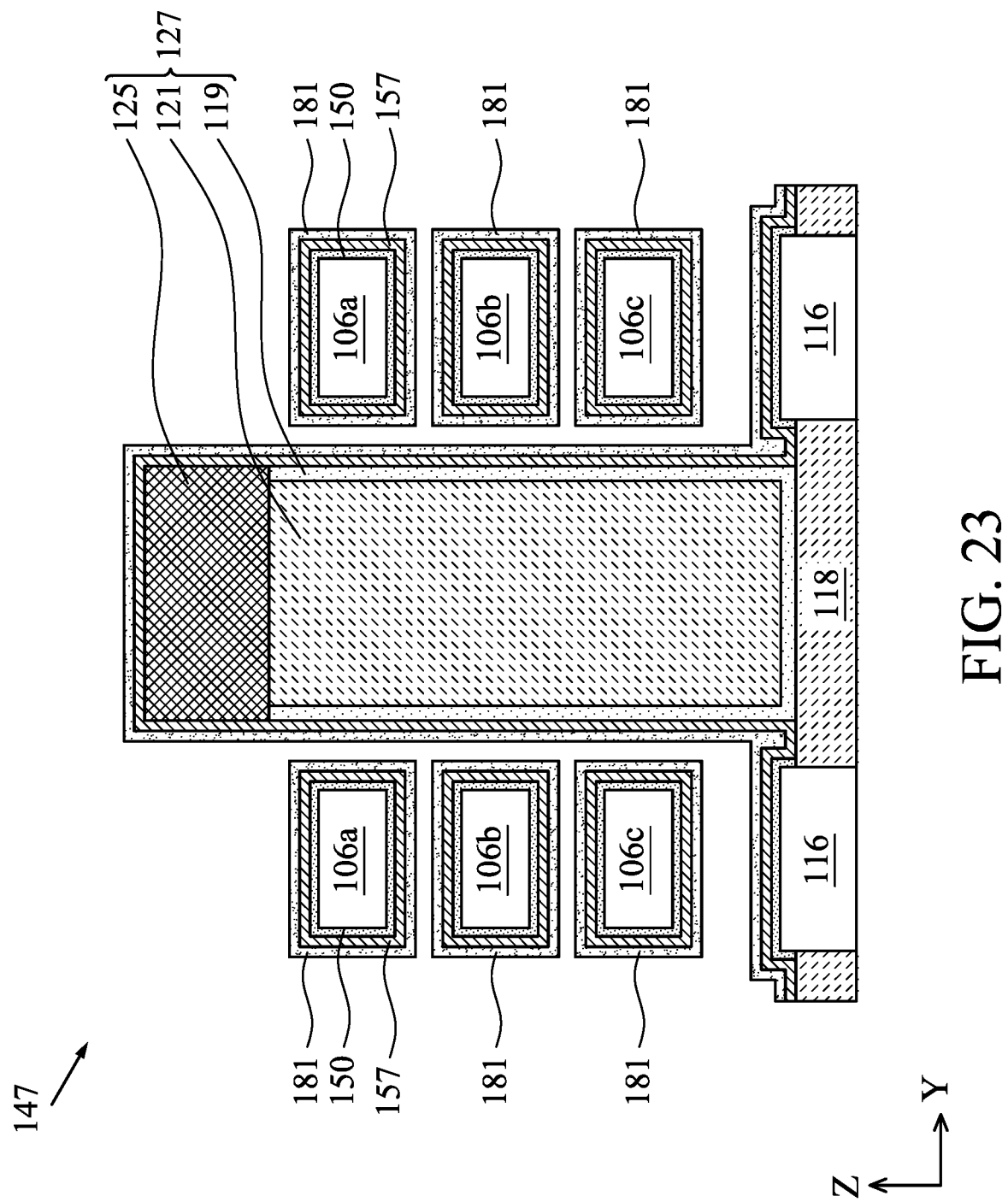
Figure 24:
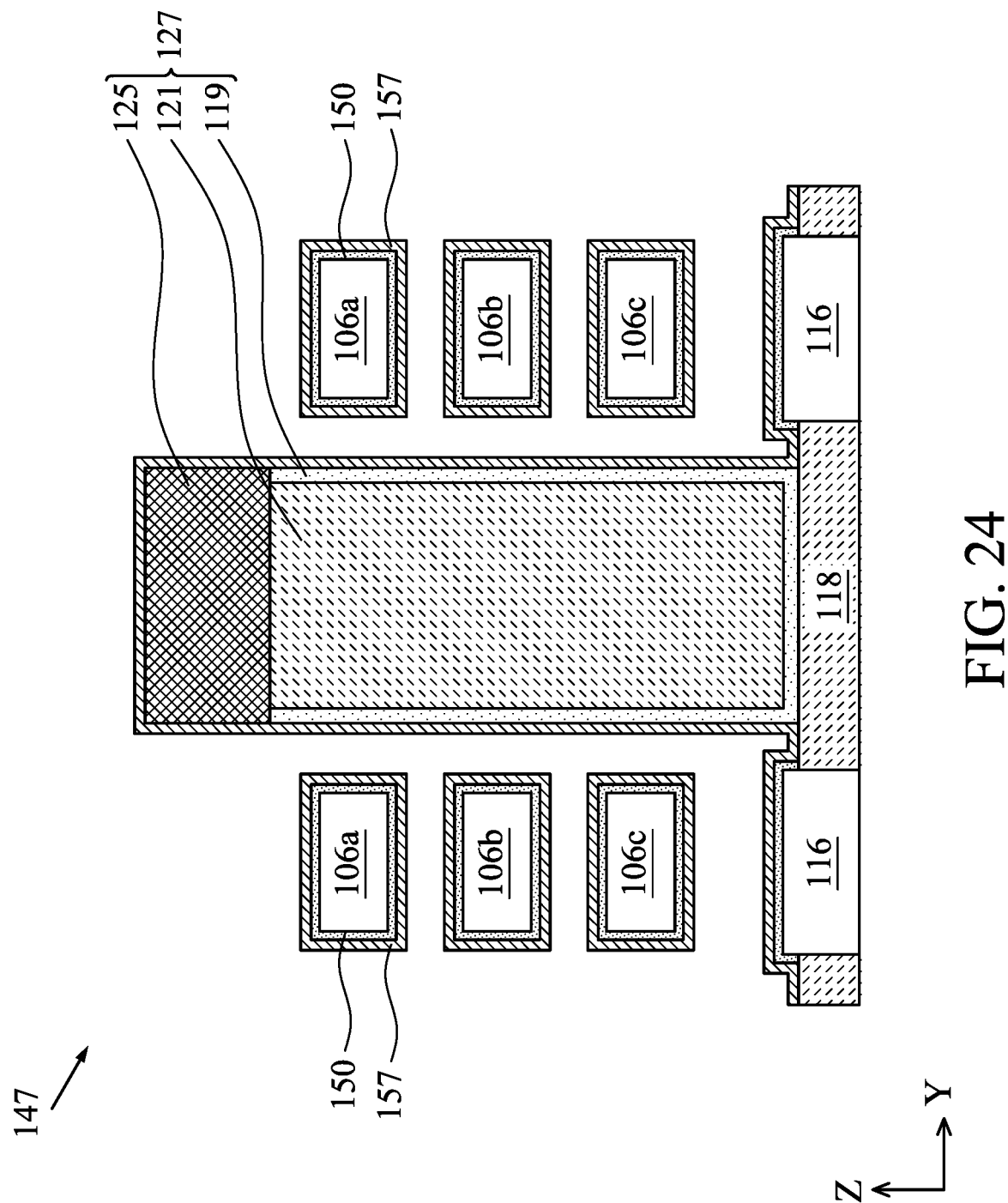

In FIG. 23, a third dipole layer 181 is formed to surround the gate dielectric layers 157 surrounding the first semiconductor layers 106a, 106b, 106c. The third dipole layer 181 may include the same or different material as the second dipole layer 179. In some embodiments, the third dipole layer 181 includes the same material as the second dipole layer 179. An annealing process is performed to drive the materials from the third dipole layers 181 into the gate dielectric layers 157 surrounding the first semiconductor layers 106a, 106b, 106c. As a result of the annealing process, the gate dielectric layers 157 surrounding the first semiconductor layers 106c include a fourth concentration of the metal or the semiconductor, the gate dielectric layers 157 surrounding the first semiconductor layers 106b include a fifth concentration of the metal or the semiconductor, and the gate dielectric layers 157 surrounding the first semiconductor layers 106a include a sixth concentration of the metal or the semiconductor. The fourth concentration is substantially greater than the fifth concentration, because the gate dielectric layers 157 surrounding the first semiconductor layers 106c already have the second concentration, which is greater than the third concentration in the gate dielectric layers 157 surrounding the first semiconductor layers 106b, before the annealing process to drive the materials from the third dipole layers 181 into the gate dielectric layers 157 surrounding the first semiconductor layers 106a, 106b, 106c. The fifth concentration is substantially greater than the sixth concentration, because the gate dielectric layers 157 surrounding the first semiconductor layers 106b already have the third concentration before the annealing process to drive the materials from the third dipole layers 181 into the gate dielectric layers 157 surrounding the first semiconductor layers 106a, 106b, 106c. In some embodiments, the fourth concentration is about 2 times to about 3 times greater than the fifth concentration, which is about 2 times to about 3 times greater than the sixth concentration. For example, the ratio of the fourth concentration to the fifth concentration ranges from about 2 to about 3, and the ratio of the fifth concentration to the sixth concentration ranges from about 2 to about 3. After the annealing process, a wet clean process is performed to remove the third dipole layers 181, as shown in FIG. 24.

In FIG. 25, the gate electrode layer 172 is formed in the opening 166 to fill the opening 166. The gate dielectric layers 157 surrounding the first semiconductor layers 106a, 106b, 106c are made of different materials having different electrical conductivity because of the annealing of the dipole layers 175, 179, 181. As a result, different voltages may be applied to the gate electrode layer 172 in order for the first semiconductor layers 106a, 106b, 106c to conduct electricity.

In some embodiments, the first semiconductor layers 106a, 106b, 106c having different compositions or dimensions may be utilized alone or in combination to achieve multiple threshold voltages in a single transistor. In some embodiments, the first semiconductor layers 106a, 106b, 106c are formed with different compositions and/or different dimensions. In some embodiments, the dipole layers 175, 179, 181 are utilized to change the compositions of the gate dielectric layers 157 surrounding the first semiconductor layers 106a, 106b, 106c. The multiple threshold voltages in the single transistor may include a first threshold voltage, a second threshold voltage substantially greater than the first threshold voltage, and a third threshold voltage substantially greater than the second threshold voltage. The different threshold voltages are determined by the different compositions and/or dimensions of the first semiconductor layers 106a, 106b, 106c. In some embodiments, the second threshold voltage is about 50 percent to about 150 percent greater than the first threshold voltage, and the third threshold voltage is about 50 percent to about 150 percent greater than the second threshold voltage. For example, the first threshold voltage may be 100 mV, the second threshold voltage may range from about 150 mV to about 200 mV, and the third threshold voltage may range from about 250 mV to about 350 mV.

Figure 26:
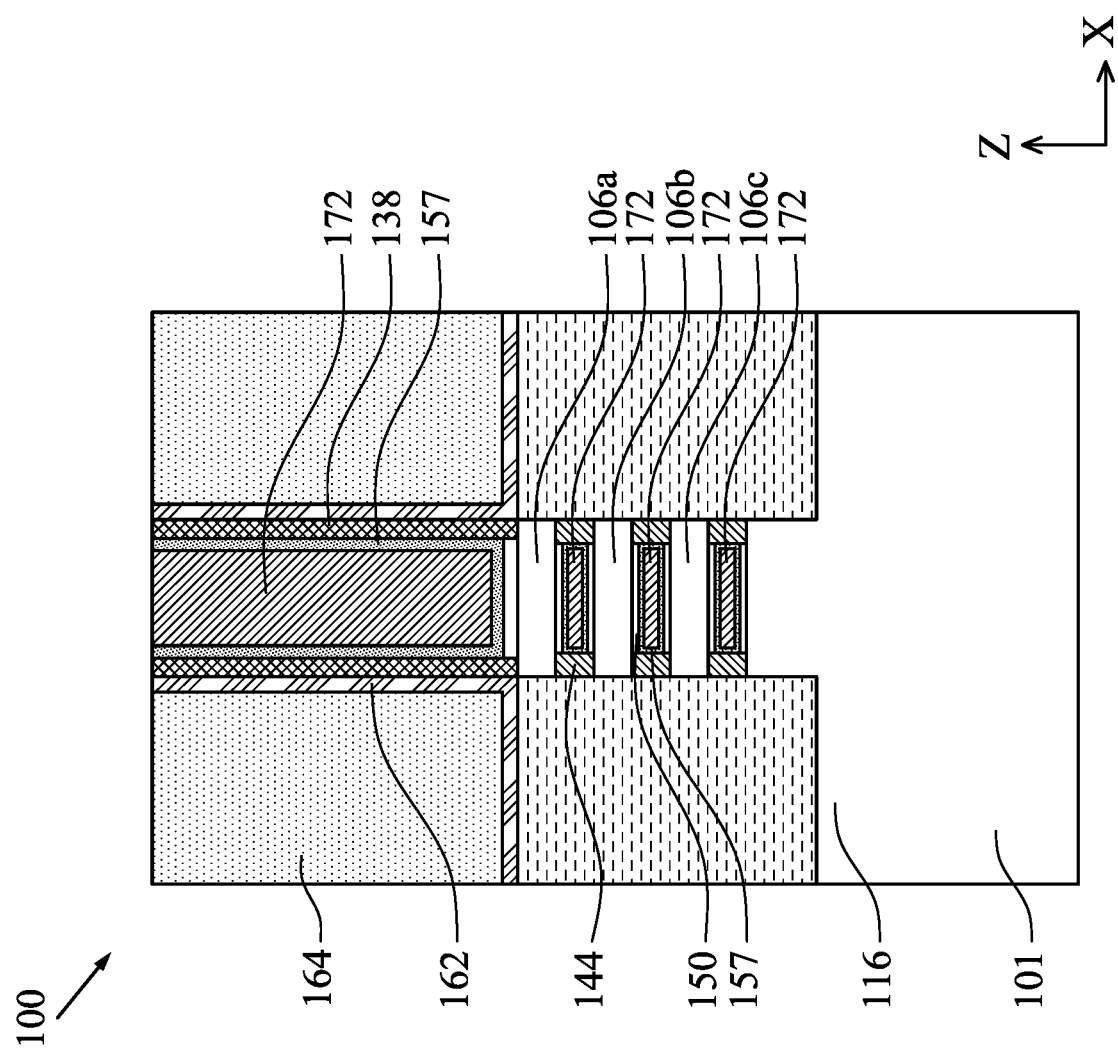
FIGS. 26-27 are cross-sectional side views of various stages of manufacturing the semiconductor device structure taken along cross-section A-A of FIG. 8, in accordance with some embodiments.

FIG. 26 is a cross-sectional side view of a stage of manufacturing the semiconductor device structure 100 taken along cross-section A-A of FIG. 8, in accordance with some embodiments. As shown in FIG. 26, which may be the stage of manufacturing the semiconductor device structure 100 shown in FIG. 15 or 16, the gate electrode layer 172 surrounds a portion of each of the first semiconductor layers 106a, 106b, 106c, and the IL 150 may be disposed between the first semiconductor layers 106a, 106b, 106c and the gate dielectric layer 157.

In some embodiments, as shown in FIG. 26, the semiconductor device structure 100 includes a transistor having a first S/D epitaxial feature 146, a second S/D epitaxial feature 146, two or more semiconductor layers 106 disposed between the first and second S/D epitaxial features 146, and a gate electrode layer 172 wraps around a portion of each of the two or more semiconductor layers 106. The two or more semiconductor layers 106 include different materials and/or dimensions having different electrical conductivity. As a result, different voltages may be applied to the gate electrode layer 172 in order to make the semiconductor layers 106 electrically conductive. In other words, the transistor has two or more threshold voltages.

Figure 27:
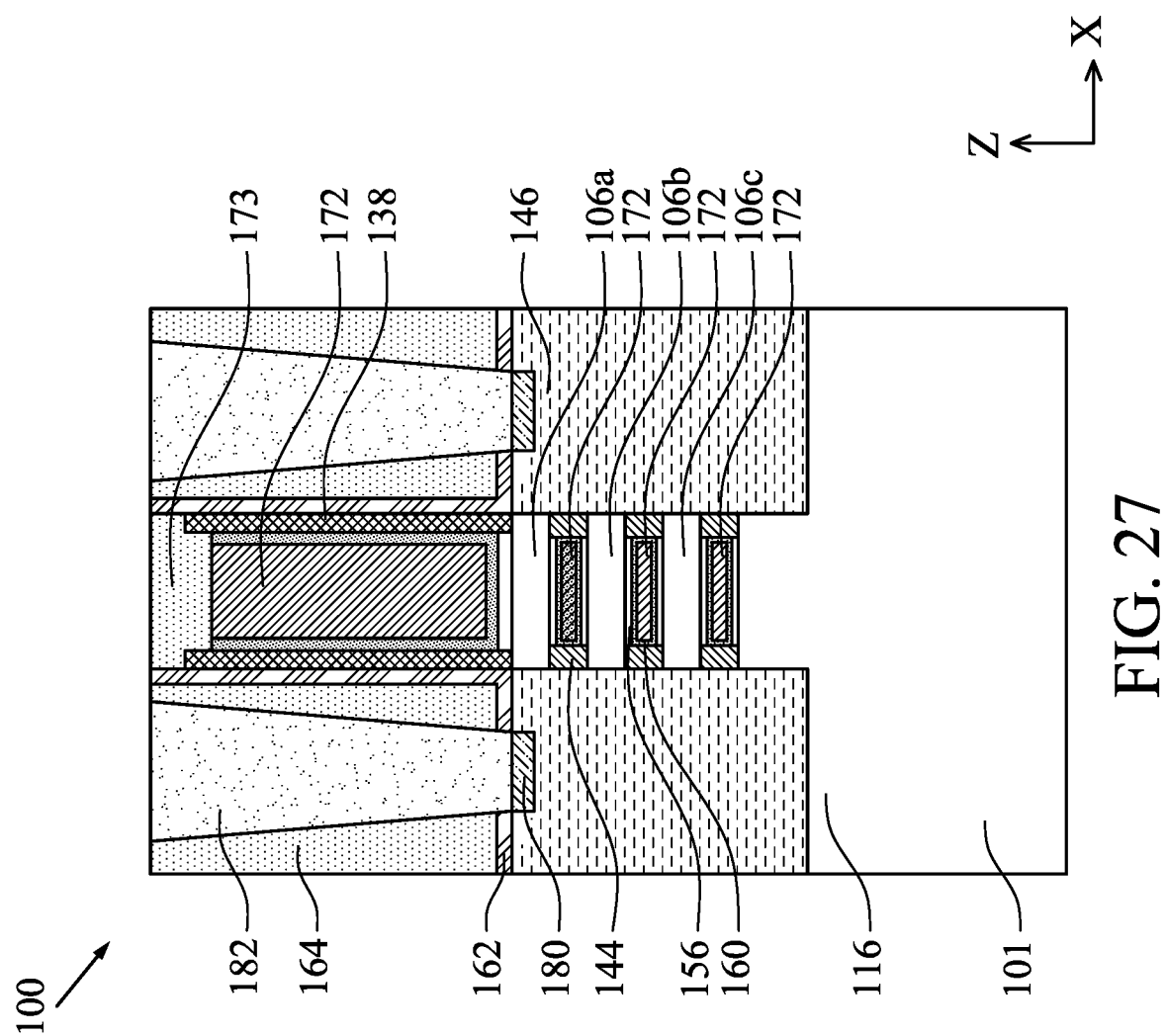

FIG. 27 is a cross-sectional side view of a stage of manufacturing the semiconductor device structure 100 taken along cross-section A-A of FIG. 8, in accordance with some embodiments. As shown in FIG. 27, the gate electrode layer 172 may be subject to one or more metal gate etching back (MGEB) processes. The MGEB processes are performed so that the top surfaces of the gate electrode layer 172 and the gate dielectric layer 157 are recessed to a level below the top surface of the gate spacers 138. In some embodiments, the gate spacers 138 are also recessed to a level below the top surface of the ILD layer 164, as shown in FIG. 27. A self-aligned contact layer 173 is formed over the gate electrode layer 172 and the gate dielectric layer 160 between the gate spacers 138. The self-aligned contact layer 173 may be a dielectric material having an etch selectivity relative to the ILD layer 164. In some embodiments, the self-aligned contact layer 173 includes silicon nitride. A gate contact (not shown) may be subsequently formed in the self-aligned contact layer 173 and in contact with the gate electrode layer 172.

After formation of the self-aligned contact layer 173, contact openings are formed through the ILD layer 164 and the CESL 162 to expose the epitaxial S/D feature 146. A silicide layer 180 is then formed on the S/D epitaxial features 146, and a contact 182 is formed in the contact opening on the silicide layer 180. The contact 182 may include an electrically conductive material, such as Ru, Mo, Co, Ni. W, Ti, Ta, Cu, Al, TiN, or TaN. While not shown, a barrier layer (e.g., TiN, TaN, or the like) may be formed on sidewalls of the contact openings prior to forming the contacts 182.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc.

Figure 28A:
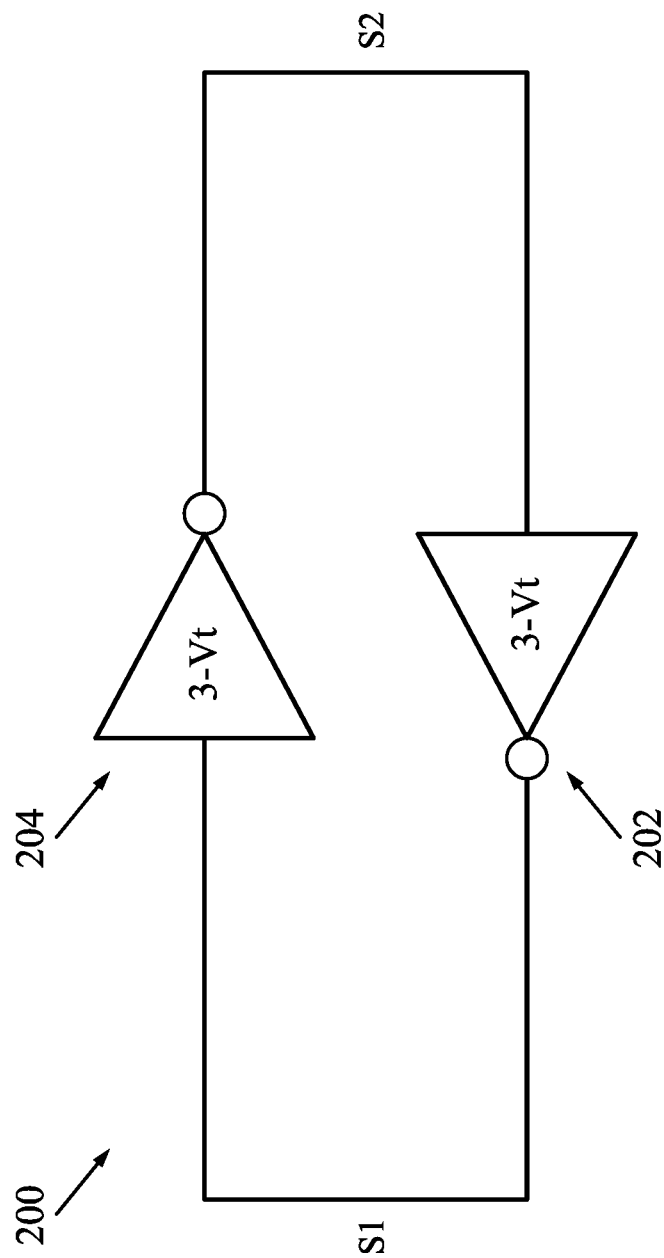
FIG. 28A illustrates a portion of a memory cell including the semiconductor device structure, in accordance with some embodiments.

FIG. 28A illustrates a portion of a memory cell 200 including the semiconductor device structure 100, in accordance with some embodiments. As shown in FIG. 28A, the memory cell 200 may be a single-port SRAM bit cell. The memory cell 200 includes a pair of cross-coupled inverters 202, 204. The inverters 202, 204 are cross coupled between two nodes S1 and S2 to form a latch. Each of the inverters 202, 204 includes one or more transistors described in FIGS. 26A and 26B. In some embodiments, each transistor in the inverters 202, 204 includes three first semiconductor layers 106 (106a, 106b, 106c) made of different materials. As a result, the memory cell 200 may be a heximal-state SRAM cell instead of a binary cell, because the memory cell 200 has 6 states, as shown in FIG. 28B. For example, at the first state, there is no electric charge at the node S1, and there is an electric charge of Q/3 at the node S2 when one of the first semiconductor layers 106 of the transistor in the inverters 202 (such as the transistor PPU1 shown in FIG. 29A) and 204 (such as the transistor NPD2 shown in FIG. 29A) are conducting electricity. At the second state, there is no electric charge at the node S1, and there is an electric charge of 2Q/3 at the node S2 when two of the first semiconductor layers 106 of the transistor in the inverters 202 (such as the transistor PPU1 shown in FIG. 29A) and 204 (such as the transistor NPD2 shown in FIG. 29A) are conducting electricity. At the third state, there is no electric charge at the node S1, and there is an electric charge of Q at the node S2 when three of the first semiconductor layers 106 of the transistor in the inverters 202 (such as the transistor PPU1 shown in FIG. 29A) and 204 (such as the transistor NPD2 shown in FIG. 29A) are conducting electricity. At the fourth state, there is no electric charge at the node S2, and there is an electric charge of Q/3 at the node S1 when one of the first semiconductor layers 106 of the transistor in the inverters 202 (such as the transistor PPU2 shown in FIG. 29A) and 204 (such as the transistor NPD1 shown in FIG. 29A) are conducting electricity. At the fifth state, there is no electric charge at the node S2, and there is an electric charge of 2Q/3 at the node S1 when two of the first semiconductor layers 106 of the transistor in the inverters 202 (such as the transistor PPU2 shown in FIG. 29A) and 204 (such as the transistor NPD1 shown in FIG. 29A) are conducting electricity. At the sixth state, there is no electric charge at the node S2, and there is an electric charge of Q at the node S1 when three of the first semiconductor layers 106 of the transistor in the inverters 202 (such as the transistor PPU2 shown in FIG. 29A) and 204 (such as the transistor NPD1 shown in FIG. 29A) are conducting electricity.

Figure 29A:
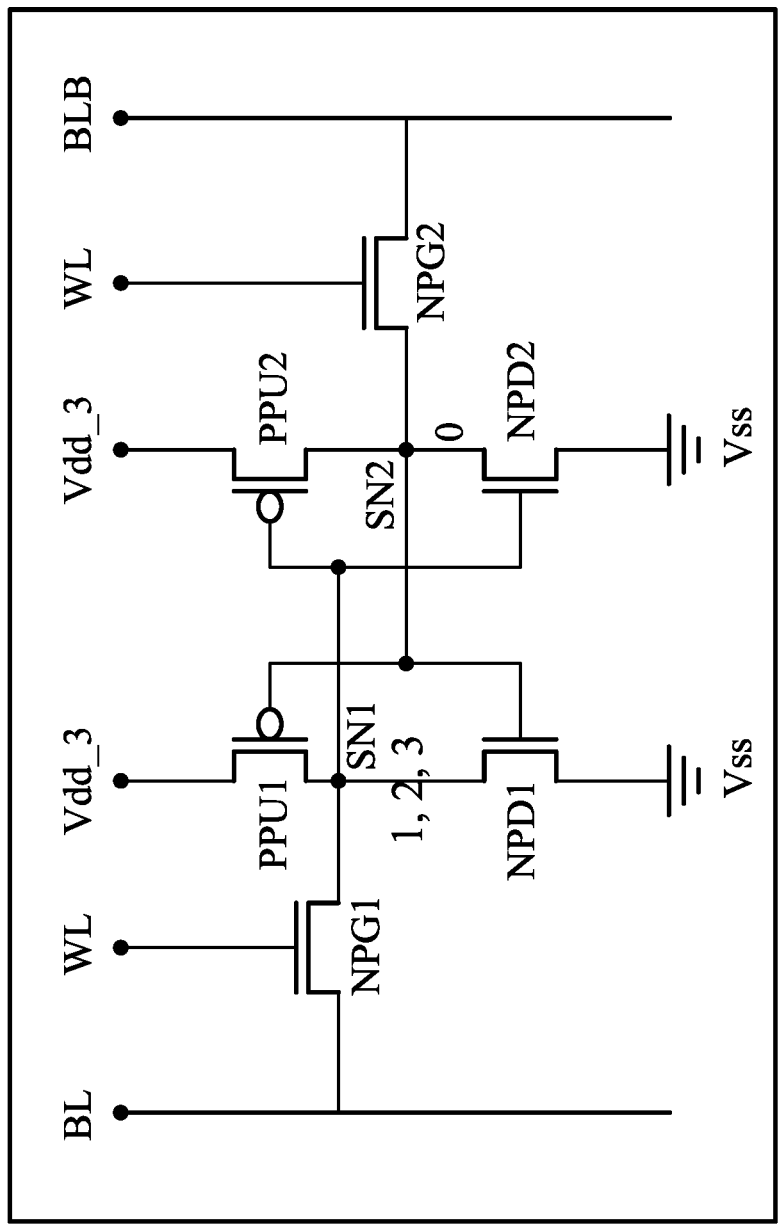
FIGS. 29A and 29B illustrate a memory cell including the semiconductor device structure, in accordance with some embodiments.
Figure 29B:
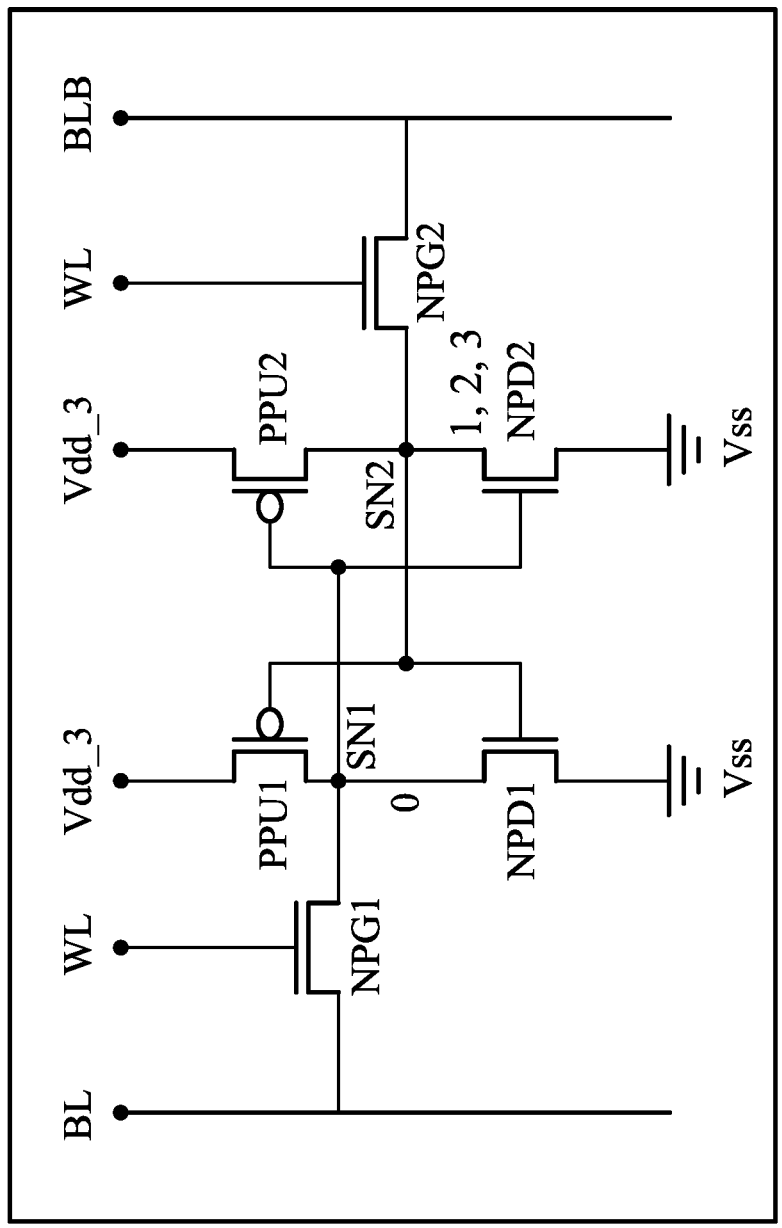

FIGS. 29A and 29B illustrate the memory cell 200 including the semiconductor device structure 100, in accordance with some embodiments. FIGS. 29A and 29B are simplified diagrams of the memory cell 200. For example, the inverter 202 (FIG. 28A) includes a pull-up transistor PPU1 and a pull-down transistor NPD-1. The pull-up transistor PPU1 is a PMOS transistor, and the pull-down transistor NPD1 is an NMOS transistor. The drain of the pull-up transistor PPU1 and the drain of the pull-down transistor NPD1 are coupled to the node SN1 connecting the pass-gate transistor NPG1. The gates of the pull-up transistor PPU1 and the pull-down transistor NPD1 are coupled to the node SN2 connecting the pass-gate transistor NPG2. Furthermore, the source of the pull-up transistor PPU1 is coupled to the positive power supply node Vdd_3, and the source of the pull-down transistor NPD1 is coupled to a ground Vss.

Similarly, the inverter 204 includes a pull-up transistor PPU2 and a pull-down transistor NPD2. The pull-up transistor PPU2 is a PMOS transistor, and the pull-down transistor NPD2 is an NMOS transistor. The drains of the pull-up transistor PPU2 and the pull-down transistor NPD2 are coupled to the node SN2 connecting the pass-gate transistor NPG2. The gates of the pull-up transistor PPU2 and the pull-down transistor NPD2 are coupled to the node SN1 connecting the pass gate transistor NPG1. Furthermore, the source of the pull-up transistor PPU2 is coupled to the positive power supply node Vdd_3, and the source of the pull-down transistor NPD2 is coupled to the ground Vss. The transistors PPU1, NPD1, PPU2, NPD2, NPG1, and NPG2 may include the transistor shown in FIGS. 26A and 26B.

As shown in FIG. 29A, when there is no electric charge at the node SN2, there can be 3 different states at the node SN1. As shown in FIG. 29B, when there is no electric charge at the node SN1, there can be 3 different states at the node SN2. Thus, the memory cell 200 is a heximal-state SRAM cell having 6 states.

Figure 29C:
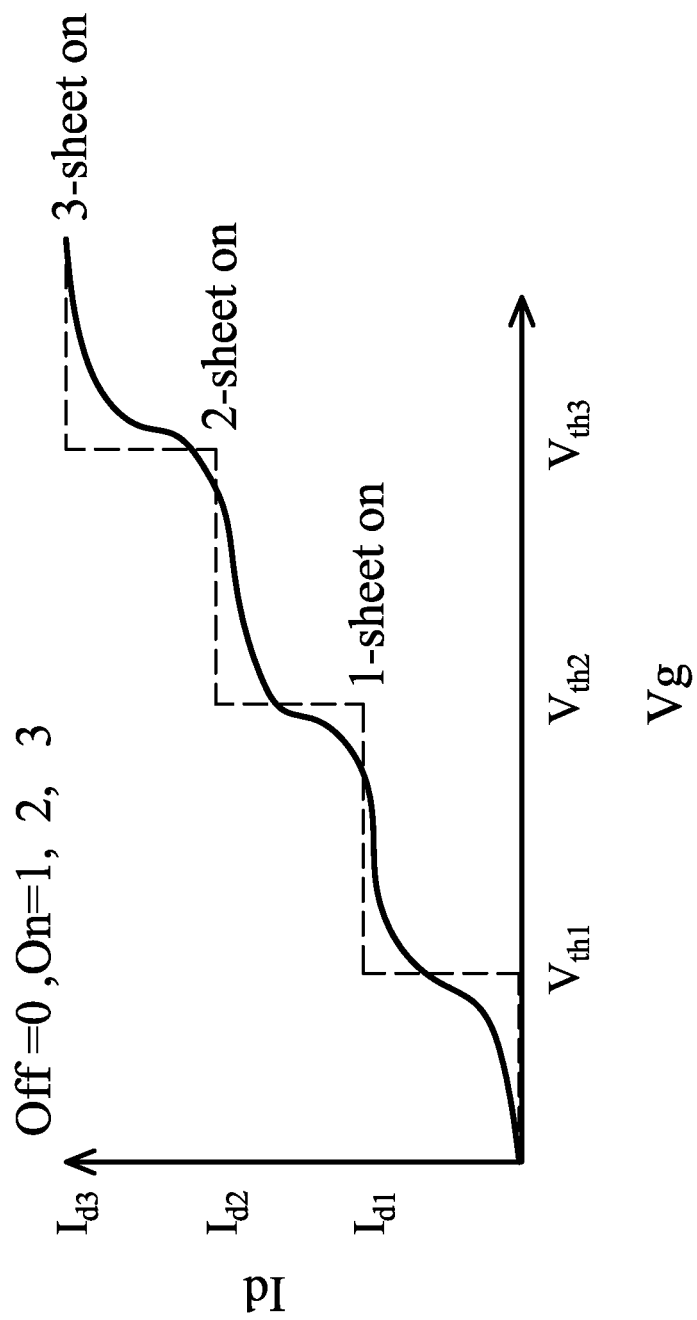
FIG. 29C illustrates a chart showing current ($I_d$) versus voltage ($V_g$) for the memory cell shown in FIGS. 29A and 29B, in accordance with some embodiments.

FIG. 29C illustrates a chart showing current ($I_d$) versus voltage ($V_g$) for the memory cell 200 shown in FIGS. 29A and 29B, in accordance with some embodiments. As shown in FIG. 29C, three different voltages ($V_{th1}$, $V_{th2}$, $V_{th3}$) may be applied to the transistor of one of the inverters 202, 204, and three corresponding currents ($I_{d1}$, $I_{d2}$, $I_{d3}$) may be the result of the different first semiconductor layers 106 becoming electrically conductivity under the different voltages ($V_{th1}$, $V_{th2}$, $V_{th3}$).

Figure 30:
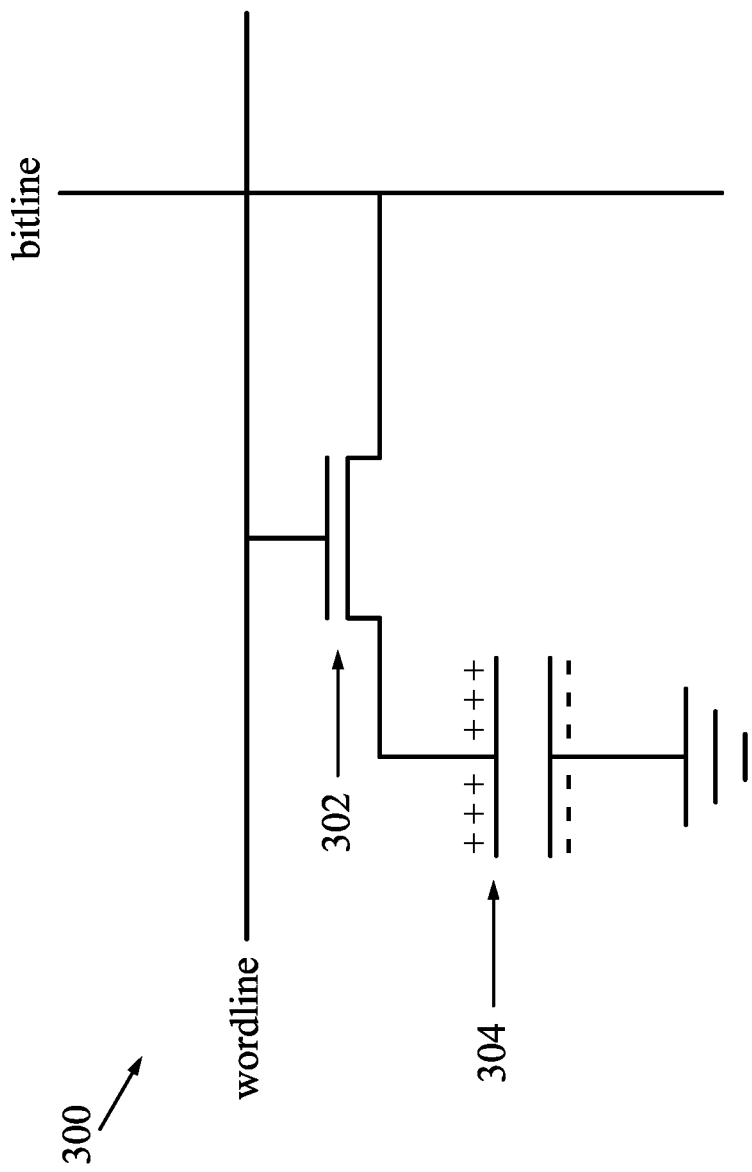
FIG. 30 illustrates a memory cell including the semiconductor device structure, in accordance with some embodiments.

FIG. 30 illustrates a memory cell 300 including the semiconductor device structure 100, in accordance with some embodiments. As shown in FIG. 30, the memory cell 300 may be a DRAM cell including a transistor 302 and a capacitor 304. The transistor 302 may be the transistor shown in FIGS. 26A and 26B. In some embodiments, the transistor 302 includes the first semiconductor layers 106 made from different materials. Thus, the capacitor may have 3 charged states (1, 2, 3) and 1 discharge state (0) due to the 3 threshold voltages of the transistor 302.

Figure 31A:
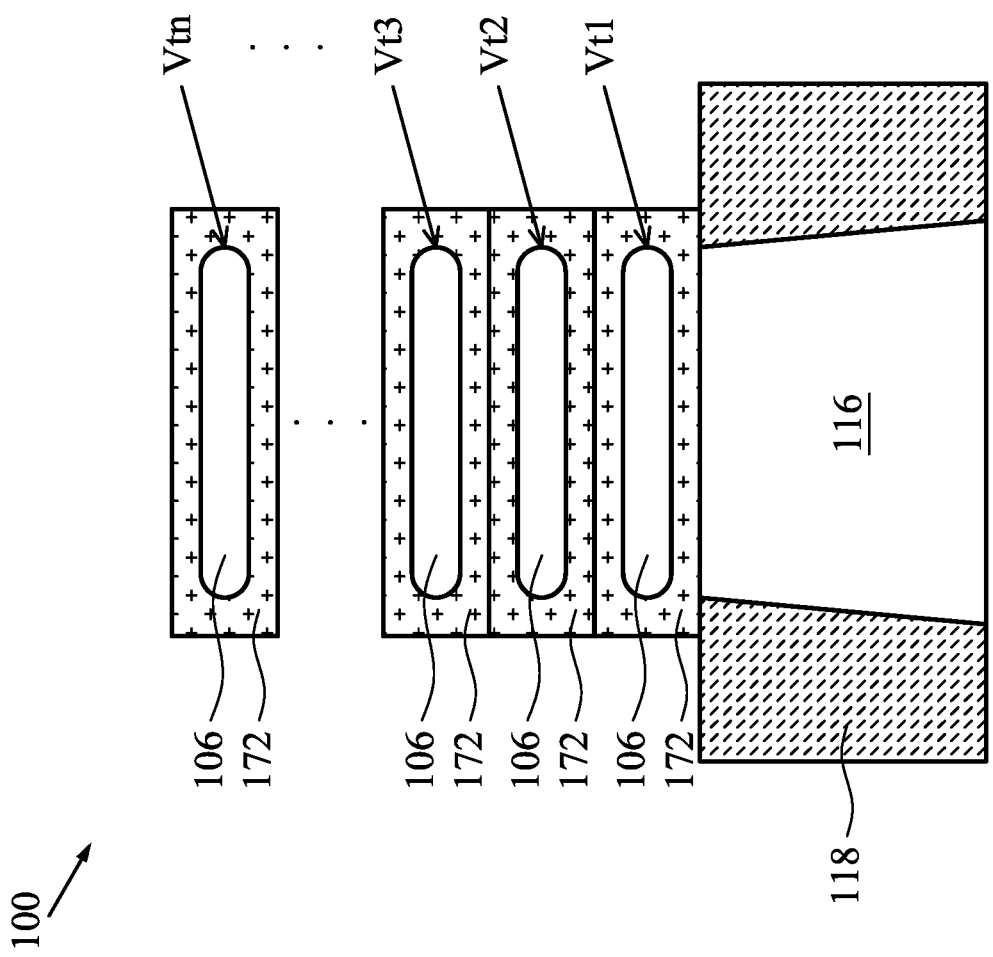
FIG. 31A is a cross-sectional side view of a portion of the semiconductor device structure, in accordance with some embodiments.

FIG. 31A is a cross-sectional side view of a portion of the semiconductor device structure 100, in accordance with some embodiments. As shown in FIG. 31A, the semiconductor device structure 100 includes the first semiconductor layers 106 and gate electrode layer 172 surrounding a portion of each of the first semiconductor layer 106. As described above, the first semiconductor layers 106 may include different materials having different conductivity. As a result, each first semiconductor layer 106 surrounded by the gate electrode layer 172 leads to a threshold voltage (Vt1, Vt2, Vt3, Vtn). The dipole layers 175, 179, 181 may be also utilized alone or in combination with the first semiconductor layers 106. As shown in FIG. 31B, the number of threshold voltages in a transistor and the number of states in the memory cell 200 are based on the number of channel (the first semiconductor layers 106).

Various embodiments or examples described herein offer multiple advantages over the state-of-art technology. According to embodiments of the present disclosure, a transistor including a first S/D epitaxial feature, a second epitaxial feature, two or more semiconductor layers disposed between the first and second S/D epitaxial features, and a gate electrode surrounding at least a portion of the two or more semiconductor layers can have two or more threshold voltages. The two or more semiconductor layers include different materials having different electric conductivity. Multiple threshold voltages in a single transistor leads to increased number of states for the transistor. As a result, device density is increased.

An embodiment is a transistor. The transistor includes a first source/drain epitaxial feature, a second source/drain epitaxial feature, and two or more semiconductor layers disposed between the first source/drain epitaxial feature and the second source/drain epitaxial feature. The two or more semiconductor layers comprise different materials. The transistor further includes a gate electrode layer surrounding at least a portion of one of the two or more semiconductor layers, wherein the transistor has two or more threshold voltages.

Another embodiment is a semiconductor device structure. The structure includes a first source/drain epitaxial feature, a second source/drain epitaxial feature, a first semiconductor layer disposed between the first source/drain epitaxial feature and the second source/drain epitaxial feature, a second semiconductor layer disposed over the first semiconductor layer between the first source/drain epitaxial feature and the second source/drain epitaxial feature, and a third semiconductor layer disposed over the second semiconductor layer between the first source/drain epitaxial feature and the second source/drain epitaxial feature. The first semiconductor layer includes a first material, the second semiconductor layer includes a second material different from the first material, and the third semiconductor layer includes a third material different from the first and second materials. The structure further includes a gate electrode layer surrounding a portion of the first, second, and third semiconductor layers.

A further embodiment is a method for forming a semiconductor device structure. The method includes forming a first fin structure and a second fin structure, each first and second fin structure includes a plurality of first semiconductor layers and a plurality of second semiconductor layers alternatingly stacked, the plurality of first semiconductor layers includes different materials, forming a sacrificial gate structure over the first and second fin structures, forming a source/drain feature on opposite sides of the sacrificial gate structure, the source/drain feature being in contact with the plurality of first semiconductor layers of the first and second fin structures, removing the sacrificial gate structure, removing the plurality of second semiconductor layers to expose portions of the plurality of first semiconductor layers of the first and second fin structures, and forming a gate electrode layer to surround at least the exposed portion of the plurality of first semiconductor layers of the first and second fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A transistor, comprising:
a first source/drain epitaxial feature;
a second source/drain epitaxial feature;
a first semiconductor layer disposed between the first and second source/drain epitaxial features, wherein the first semiconductor layer comprises a semiconductor material having a dopant at a first dopant concentration;
a second semiconductor layer disposed over the first semiconductor layer and between the first and second source/drain epitaxial features, wherein the second semiconductor layer comprises a semiconductor material having a dopant at a second dopant concentration;
a third semiconductor layer disposed over the second semiconductor layer and between the first and second source/drain epitaxial features, wherein the third semiconductor layer comprises a semiconductor material having a dopant at a third dopant concentration, wherein the first dopant concentration is substantially greater than the second dopant concentration, which is substantially greater than the third dopant concentration;
and
a gate electrode layer surrounding at least a portion of the first, second, and third semiconductor layers, wherein the transistor has two or more threshold voltages.

2. The transistor of claim 1, further comprising:
a first dielectric spacer disposed between the first source/drain epitaxial feature and the gate electrode layer; and
a second dielectric spacer disposed between the second source/drain epitaxial feature and the gate electrode layer.

3. The transistor of claim 2, further comprising:
an interfacial layer disposed between each of the first, second, and third semiconductor layers and the gate electrode layer; and
a gate dielectric layer disposed between the interfacial layer and the gate electrode layer.

4. The transistor of claim 1, wherein the first dopant concentration is about 20 percent to about 100 percent greater than the second dopant concentration, which is about 20 percent to about 100 percent greater than the third dopant concentration.

5. The semiconductor device structure of claim 1, wherein the first semiconductor layer has a first thickness, the second semiconductor layer has a second thickness different from the first thickness, and the third semiconductor layer has a third thickness different from the first and second thicknesses.

6. The semiconductor device structure of claim 5, wherein the first thickness is about 50 percent to about 150 percent greater than the second thickness, which is about 50 percent to about 150 percent greater than the third thickness.

7. The semiconductor device structure of claim 5, wherein the third thickness is about 50 percent to about 150 percent greater than the second thickness, which is about 50 percent to about 150 percent greater than the first thickness.

8. A semiconductor device structure, comprising:
a first source/drain epitaxial feature;
a second source/drain epitaxial feature;
a first semiconductor layer disposed between the first source/drain epitaxial feature and the second source/drain epitaxial feature, wherein the first semiconductor layer comprises silicon germanium having a first germanium concentration;
a second semiconductor layer disposed over the first semiconductor layer between the first source/drain epitaxial feature and the second source/drain epitaxial feature, wherein the second semiconductor layer comprises silicon germanium having a second germanium concentration different from the first germanium concentration;
a third semiconductor layer disposed over the second semiconductor layer between the first source/drain epitaxial feature and the second source/drain epitaxial feature, wherein the third semiconductor layer comprises silicon germanium having a third germanium concentration different from the first and second germanium concentrations; and
a gate electrode layer surrounding a portion of first, second, and third semiconductor layers.

9. The semiconductor device structure of claim 8, wherein the first germanium concentration ranges from about 2 atomic percent to about 30 atomic percent, the second germanium concentration ranges from about 1 atomic percent to about 20 atomic percent, and the third germanium concentration ranges from about 0 atomic percent to about 10 atomic percent.

10. The semiconductor device structure of claim 8, wherein the first semiconductor layer has a first thickness, the second semiconductor layer has a second thickness different from the first thickness, and the third semiconductor layer has a third thickness different from the first and second thicknesses.

11. The semiconductor device structure of claim 10, wherein the first thickness is about 50 percent to about 150 percent greater than the second thickness, which is about 50 percent to about 150 percent greater than the third thickness.

12. The semiconductor device structure of claim 10, wherein the third thickness is about 50 percent to about 150 percent greater than the second thickness, which is about 50 percent to about 150 percent greater than the first thickness.

13. The semiconductor device structure of claim 8, further comprising:
- an interfacial layer disposed between each of the first, second, and third semiconductor layers and the gate electrode layer; and
- a gate dielectric layer disposed between each interfacial layer and the gate electrode layer.

14. The semiconductor device structure of claim 13, wherein the gate dielectric layers comprise different materials.

15. A method for forming a semiconductor device structure, comprising:
- forming a first fin structure and a second fin structure, each first and second fin structure comprises a plurality of first semiconductor layers and a plurality of second semiconductor layers alternatingly stacked, wherein the plurality of first semiconductor layers comprises three semiconductor layers comprising different materials;
- forming a sacrificial gate structure over the first and second fin structures;
- forming a source/drain feature on opposite sides of the sacrificial gate structure, the source/drain feature being in contact with the plurality of first semiconductor layers of the first and second fin structures;
- removing the sacrificial gate structure;
- removing the plurality of second semiconductor layers to expose portions of the plurality of first semiconductor layers of the first and second fin structures;
- forming first dipole layers surrounding at least a portion of the three semiconductor layers;
- forming a first sacrificial layer surrounding the first dipole layer surrounding one of the three semiconductor layers; and
- removing the first dipole layers not surrounded by the first sacrificial layer; and
- forming a gate electrode layer to surround at least the exposed portion of the plurality of first semiconductor layers of the first and second fin structures.

16. The method of claim 15, further comprising:
- removing the first sacrificial layer;
- performing a first annealing process to drive materials from the first dipole layer into a first gate dielectric layer; and
- removing the first dipole layer.

17. The method of claim 16, further comprising:
- forming second dipole layers surrounding at least a portion of the three semiconductor layers;
- forming a second sacrificial layer surrounding the second dipole layers surrounding two of the three semiconductor layers;
- removing the second dipole layer not surrounded by the second sacrificial layer;
- removing the second sacrificial layer;
- performing a second annealing process to drive materials from the second dipole layers into the first gate dielectric layer and a second gate dielectric layer; and
- removing the second dipole layers.

18. The method of claim 17, further comprising:
- forming third dipole layers surrounding at least a portion of the three semiconductor layers;
- performing a third annealing process to drive materials from the third dipole layers into the first gate dielectric layer, the second gate dielectric layer, and a third gate dielectric layer; and
- removing the third dipole layers.

19. The method of claim 18, wherein the gate electrode layer is formed on the first, second, and third gate dielectric layers.

20. The method of claim 18, wherein the materials from the first, second, and third dipole layers comprise aluminum oxide, titanium dioxide, germanium oxide, lanthanum oxide, magnesium oxide, yttrium oxide, or gadolinium oxide.

* * * * *